(12) United States Patent
Tsuneta et al.

(10) Patent No.: US 8,963,102 B2
(45) Date of Patent: Feb. 24, 2015

(54) CHARGED PARTICLE BEAM MICROSCOPE, SAMPLE HOLDER FOR CHARGED PARTICLE BEAM MICROSCOPE, AND CHARGED PARTICLE BEAM MICROSCOPY

(71) Applicant: Hitachi High-Technologies Corporation, Minato-ku, Tokyo (JP)

(72) Inventors: Ruriko Tsuneta, Tokyo (JP); Hideki Kikuchi, Tokyo (JP); Hideo Kashima, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/373,359

(22) PCT Filed: Jan. 11, 2013

(86) PCT No.: PCT/JP2013/050355
§ 371 (c)(1),
(2) Date: Jul. 20, 2014

(87) PCT Pub. No.: WO2013/108711
PCT Pub. Date: Jul. 25, 2013

(65) Prior Publication Data
US 2014/0353500 A1 Dec. 4, 2014

(30) Foreign Application Priority Data
Jan. 20, 2012 (JP) .................................. 2012-009554

(51) Int. Cl.
*H01J 37/26* (2006.01)
*H01J 37/20* (2006.01)

(52) U.S. Cl.
CPC ............... *H01J 37/20* (2013.01); *H01J 37/26* (2013.01); *H01J 2237/2008* (2013.01); *H01J 2237/20214* (2013.01)
USPC .................................................. 250/442.11

(58) Field of Classification Search
USPC ............................................ 250/442.11, 311
See application file for complete search history.

(56) References Cited

U.S. PATENT DOCUMENTS

| 6,538,254 B1 | 3/2003 | Tomimatsu et al. |
| 7,091,498 B2 * | 8/2006 | Moriya .................... 250/442.11 |

(Continued)

FOREIGN PATENT DOCUMENTS

| JP | 08-304243 A | 11/1996 |
| JP | 2001-066231 A | 3/2001 |

(Continued)

OTHER PUBLICATIONS

Phatak, C., et al., "Vector field electron tomography of magnetic materials: Theoretical development", Ultramicroscopy 108 (2008) 503-513.

*Primary Examiner* — Kiet T Nguyen
(74) *Attorney, Agent, or Firm* — Miles & Stockbridge P.C.

(57) ABSTRACT

An apparatus that can capture a rotation series of images of an observation area within a range of −180° to +180° around the x axis thereof, and can capture a rotation series of images of the observation area within a range of −180° to +180° around the y axis thereof. The apparatus includes a sample mounting base having at its tip portion a mounting portion for mounting a sample thereon; a rotating jig having a mounting base holding portion that holds the sample mounting base; a sample holding rod that includes a holding portion that holds the rotating jig; a first rotation control unit that applies, to the sample holding rod, a first rotation within a range of −180° to +180° with the extending direction of the sample holding rod as the axis thereof; and a second rotation control unit that applies, to the rotating jig, a second rotation within a range of ±45° or more with the direction orthogonal to the rotation axis of the first rotation as the axis thereof, the sample mounting base being in a conical or polygonally conical form.

15 Claims, 20 Drawing Sheets

(56) References Cited

U.S. PATENT DOCUMENTS

| | | | |
|---|---|---|---|
| 7,863,564 B2 * | 1/2011 | Tsuneta et al. | 250/306 |
| 2012/0112064 A1 * | 5/2012 | Nagakubo et al. | 250/307 |

FOREIGN PATENT DOCUMENTS

| | | |
|---|---|---|
| JP | 2001-256912 A | 9/2001 |
| JP | 2004-508661 A | 3/2004 |
| JP | 3547143 B2 | 7/2004 |
| JP | 3106846 U | 1/2005 |
| JP | 2005-174808 A | 6/2005 |
| JP | 2007-188905 A | 7/2007 |
| JP | 2008-135396 A | 6/2008 |
| JP | 2009-110734 A | 5/2009 |
| JP | 2010-003617 A | 1/2010 |
| JP | 2010-198985 A | 9/2010 |
| JP | 2013-149507 A | 8/2013 |
| WO | WO 02/11174 A1 | 2/2002 |

* cited by examiner (a)

(b)

(c)

CHARGED PARTICLE BEAM MICROSCOPE, SAMPLE HOLDER FOR CHARGED PARTICLE BEAM MICROSCOPE, AND CHARGED PARTICLE BEAM MICROSCOPY

TECHNICAL FIELD

The present invention relates to a microscope and a method for analyzing an electromagnetic field structure of a sample with charged particle beams.

BACKGROUND ART

Vector field tomography described in NPL 1 is mentioned as a technique that three-dimensionally analyzes an electromagnetic field structure of a sample from transmission electron photomicrographs. NPL 1 describes that, in order to reconstruct a vector component, that is, three orthogonal components (x, y, z) assigned to individual pixels, a rotation series of images of an observation area at any angle, that is, within a range of −180° to +180°, around the x axis and a rotation series of images of an observation area at any angle, that is, within a range of −180° to +180°, around the y axis, are necessary. The following documents and places of the documents may be mentioned as techniques related to this field.

In PTL 1 (JP 2004-508661 W), there is a description reading: "A sample holder including a sample cradle (12) having a sample grid (14) configured to support a sample (13) to be analyzed; a transfer mechanism (16) that rotates a sample cradle (12) within a sample holder in a plane of the sample (13); a mechanism that inclines a sample cradle (12); and a cryoshutter that, during cryotransfer, protects the sample and can be transferred from a first position at which the sample is protected, to a retracted position are provided (see FIG. 1 and [0012]). There is also a description reading: "A first direction of a sample (13) is determined and a sample cradle (12) is inclined by substantially ±70° to obtain a first set of data. The sample (13) is preferably rotated by 90° on a plane of the sample (13) with a motion transfer mechanism (16) and a second set of inclination data is obtained through substantially ±70." (see [0015]).

In PTL 2 (JP 2007-188905 A), there is a description reading: "The sample holder 8 is provided with a mechanism in which a holder axis 31 per se connected to the tip of the sample holder 8 is rotated, umbrella gears 32 and 38. The whole tip of the holder 8 can be rotated by 360° around the axis. The umbrella gear 32 is provided at the tip of a sample rotation axis 33. Further, since the umbrella gear 32 and the umbrella gear 38 are in contact with each other so as to engage with each other, the umbrella gear 38 can be rotated by 360° by operating the sample rotation axis 33. A sample base 35 is mounted on a fixed base 39 on the umbrella gear 38. A microsample piece 36 is attached to the tip of the sample base 35." (see FIG. 7 and [0019]). There is also a description reading: "A holder 8 is inserted into a sample chamber in a transmission electron microscope 1, and electron beams 17 are introduced from a side surface of the sample base 35. That is, electron beams 17 are introduced from a direction perpendicular to a paper surface to observe transmission images. In this case, the umbrella gear 34 can be rotated by moving the sample rotation axis 33 to observe the sample from a direction of 360° around the sample 36." (see FIG. 5 and [0016]).

In PTL 3 (JP 2001-256912 A), there is a description reading: "A sphere 5, a sample holding rod 6 that is passed into and fixed to the center of the sphere 5, a rotating inner cylinder 3 having a spherical seat for holding the sphere 5, and a rod 4 for inclination that performs inclination of the sphere 5 are provided at the tip of a sample holder 1, and the tip is inserted into an electron lens 11 of an electron microscope. A sample 7 is held on the electron beam 12 side of the sample holding rod 6. An inclined surface of the tip of the rod 4 for inclination is pressed against one end of the sample holding rod 6 to operate the inclination of the Z axis and the Y axis, the rod 4 for inclination is retracted, the inclined surface is rotated in a predetermined inclination direction to again perform pressing to a predetermined inclination angle and thus to change the inclination direction." (see FIG. 1 and [Solution] in [Abstract]). There is also a description reading: "Two rotation drive mechanisms and one straight advance drive mechanism of a side entry-type sample transfer apparatus including a eucentric-type transfer mechanism are provided on the atmosphere side of the sample holder 1. One of the rotation drive mechanisms is used in 360-degree rotation Θx (theta x) of the X-axis and is connected to the rotating inner cylinder 3. The other rotation drive mechanism and the straight advance drive mechanism are used in inclination operation Θz (theta z) and Θy (theta y) in the Z and Y axes and are connected to the rod 4 for inclination that is placed within the rotating inner cylinder 3." (see [0013]).

In PTL 4 (JP 8-304243 A), there is a description reading: "A ring 16 and a disk 17 are provided at the tip of a sample fixation rod 11. As indicated by an arrow K in FIG. 5(b), the ring 16 is supported by two points at the tip of the sample fixation rod 11, tiltably around an axis line orthogonal to an axis line of the sample fixation rod 11. As illustrated in the drawing, when an axis line of the sample fixation rod 11 is regarded as X axis, the ring is tiltable to 90 degrees to a plane including X axis. The disk 17 is mounted on the ring 16 through a rotation mechanism and can be rotated by 360 degrees within an end plane of the ring 16." (see FIG. 5 and [0023]).

CITATION LIST

Patent Literatures

PTL 1: JP 2004-508661 W
PTL 2: JP 2007-188905 A
PTL 3: JP 2001-256912 A
PTL 4: JP 8-304243 A
PTL 5: JP 2010-198985 A
PTL 6: JP 3547143 B1
PTL 7: JP 2009-110734 A

Non-Patent Literature

NPL 1: C. Phatak, M. Beleggia and M. De Graef: Ultramocroscopy, Vol. 108, (2008) 503-513.

SUMMARY OF INVENTION

Technical Problem

An object of the present invention is to provide an apparatus that can capture a rotation series of images of an observation area within a range of −180° to +180° around the x axis and a rotation series of images of an observation area within a range of −180° to +180° around the y axis, from the viewpoint of significantly improving accuracy of an electromagnetic field structure analysis of an observation area. The procedure of the capture of images is as follows. (a) A first rotation axis orthogonal to a light axis of a microscope is set parallel to x axis of a sample. (b) A rotation series of images of an observation area within a range of −180° to +180° around the x axis are captured with a first rotation angle control mechanism. (c) A first rotation axis is set parallel to y axis of the sample. (d) A rotation series of images of an observation area within a range of −180° to +180° around the y axis are captured with a first rotation angle control mechanism. When the above procedure is carried out, the object cannot be attained by the prior art. The reason for this will be described.

At the outset, a review will be made about a case where a sample holder illustrated in FIG. 1 in PTL 1 is used. (a) An x axis of the sample can be adjusted to an inclination axis of a sample cradle (12) as a first rotation axis orthogonal to a light axis of the microscope. (b) Even when the sample cradle (12) is inclined, however, what is obtained is only a rotation series of images of an observation area within a range of ±70° around the x axis, and a rotation series of images within a range of −180° to +180° cannot be obtained. This is so because rotation by ±70° or more causes the cradle (12), the moving mechanism (16) and the like to block a light path of incident electron beams or transmitted electron beams.

Next, a review will be made about a case where a sample holder illustrated in FIG. 7 in PTL 2 is used. (a) An x axis of the sample can be adjusted to a rotation axis of the holder 31 as a first rotation axis orthogonal to a light axis of the microscope. (b) Even when the holder 31 is rotated, however, a rotation series of images of an observation area within a range of −180° to +180° around x axis cannot be obtained. This is so because an angle range in which the umbrella gear 34 and the like block the light path of the incident electron beams or transmitted electron beams exists. Further, a review will be made about a case where a sample holder illustrated in FIG. 5 in PTL 2 is used. (a) An x axis of the sample can be adjusted to a rotation axis of the umbrella gear 34 as a first rotation axis orthogonal to a light axis of the microscope. (b) When the umbrella gear 34 is rotated, a rotation series of images of an observation area within a range of −180° to +180° around x axis can be obtained. (c) Since, however, the rotation axis of the holder 31 is fixed to a direction orthogonal to the light axis of the microscope, the y axis of the sample cannot be set parallel to the rotation axis of the umbrella gear 34.

Further, a review will be made about a case where a sample holder illustrated in FIG. 1 in PTL 3 is used. (a) An x axis of the sample can be adjusted to a rotation axis of Θx as a first rotation axis orthogonal to the light axis of the microscope. (b) Θx can be changed by 360° by rotating the rotating inner cylinder 3, and, thus, a rotation series of images of an observation area within a range of −180° to +1800 around x axis can be obtained. (c) However, the y axis of the sample cannot be set parallel to the first rotation axis, because Θy and Θz can only be changed in a range of ± a few tens of degrees. A range of angles that can be changed with respect to Θy and Θz is restricted by an angle at which the sample holding rod 6 comes into contact with the rotating inner cylinder 3 that supports the sphere 5. When the diameter of the hole at the tip of the rotating inner cylinder 3 is increased from the viewpoint of increasing the rotation angle range of Θy and Θz to ±45°, pressing the rod 4 for inclination for sample inclination purposes causes popping-out of the sphere 5. Accordingly, the sample cannot be rotated by ±45° around an axis parallel to the light axis of the microscope, and, thus, the y axis of the sample cannot be set parallel to the first rotation axis.

Further, a review will be made about a case where a sample holder illustrated in FIG. 5 in PTL 4 is used. (a) The x axis of the sample can be adjusted to an axis line of the sample fixation rod 11 as a first rotation axis orthogonal to the light axis of the microscope. (b) When the sample fixation rod 11 is rotated, a rotation series of images of an observation area within a range of −180° to +180° around x axis can be obtained. In this case, however, the capture of images is possible only when the normal of the disk 17 is parallel to the first rotation axis. (c) The y axis of the sample can be adjusted to the first rotation axis by rotating the sample fixation rod 11 to set the rotation axis of rotation indicated by an arrow K in FIG. 5(b) parallel to the light axis of the microscope and then rotating the disk 17 in the direction of K by 90°. This rotation, however, disadvantageously causes the normal of the disk 17 to be rendered orthogonal to the first rotation axis. (d) When the sample fixation rod 11 is rotated, the disk 17 blocks the light path of electron beams incident on the sample or electron beams transmitted through the sample, making it impossible to obtain a rotation series of images of an observation area within a range of −180° to +180° around y axis.

As is apparent from the foregoing description, the prior art is disadvantageous in that a rotation series of images of an observation area within a range of −180° to +180° around the x axis and a rotation series of images of an observation area within a range of −180° to +180° around the y axis cannot be captured and, unlike the invention of the present application, 3D vector field tomography cannot be suitably analyzed.

Solution to Problem

In order to solve the above-described problem, a sample holder for a charged particle beam microscope according to the present application includes: a sample mounting base having at its tip portion a mounting portion for mounting a sample thereon; a rotating jig having a mounting base holding portion for holding the sample mounting base; a sample holding rod having a holding portion for holding the rotating jig; a first rotation control unit that applies, to the sample holding rod, a first rotation within a range of −180° to +180° with the extending direction of the sample holding rod as the axis thereof; an a second rotation control unit that applies, to the rotating jig, a second rotation within a range of +45° or more with a direction orthogonal to a rotation axis of the first rotation as the axis thereof, wherein the sample mounting base is in a conical or polygonally conical form.

According to another aspect of the present application, there is provided a charged particle beam microscope including: an illuminating optical system that applies charged particle beams to a sample; and a sample holder that sets a position and an angle of the sample to the charged particle beams, wherein the sample holder includes a sample mounting base having at its tip portion a mounting portion for mounting a sample thereon, a rotating jig having a mounting base holding portion for holding the sample mounting base, a sample holding rod having a holding portion for holding the rotating jig, a first rotation control unit that applies, to the sample holding rod, a first rotation within a range of −180° to +180° with the direction orthogonal to the illumination axis of the charged particle beam as the axis thereof, and a second rotation control unit that applies, to the rotating jig, a second rotation within a range of ±45° or more with the direction parallel to an illumination axis of the charged particle beam as the axis thereof, and the sample mounting base is in a conical or polygonally conical form.

According to a further aspect of the present application, there is provided a charged particle beam microscopy in a charged particle beam microscope including: an illuminating optical system that applies charged particle beams to a sample; and a sample holder that sets a position and an angle of the sample to the charged particle beams, the charged particle beam microscopy including: a first step of applying, to the sample, a first rotation with the direction orthogonal to the illumination axis of the charged particle beam as the axis thereof to obtain a rotation series of images of an observation area within a range of −180° to +180° around the x axis thereof; a second step of applying, to the sample, a second rotation within a range of ±45° or more with the direction parallel to an illumination axis of the charged particle beam as the axis thereof; and a third step of applying, to the sample, a third rotation with the direction orthogonal to the illumination axis of the charged particle beam as the axis thereof to obtain a rotation series of images of an observation area within a range of −180° to +180° around the y axis thereof.

Advantageous Effects of Invention

The use of the apparatus and method according to the present invention can contribute to an improvement in accuracy of an electromagnetic field structure analysis of an observation area in a measurement sample.

DESCRIPTION OF EMBODIMENTS

First Embodiment

A first embodiment illustrates a case example where a saliently machined sample is mounted on a sample holder (FIG. 1) and a rotation series of images of an observation area within a range of −180° to +180° around the x-axis thereof and a rotation series of images of the observation area within a range of −180° to +180° around the y-axis thereof are captured under an electron beam interference microscope.

Figure 2:
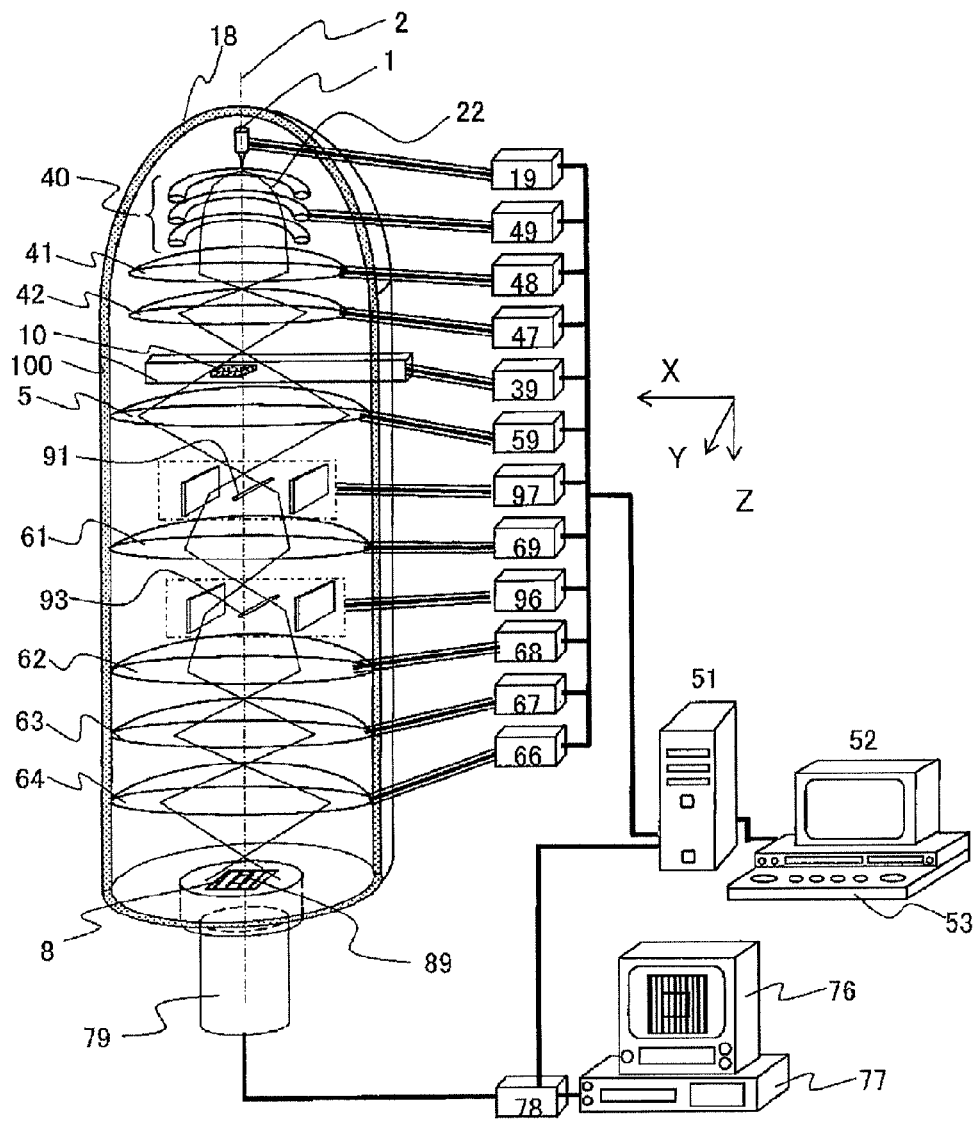
FIG. 2 is a block diagram of an electron beam interference microscope.

FIG. 2 is a schematic diagram of an electron beam interference microscope that constitutes a two-step electron beam biprism interference optical system. An electron gun 1 as an electron source is located at an uppermost stream portion in an electron beam flow direction, and the electron beam is accelerated to a predetermined speed with an accelerating tube 40, is then passed through an illuminating optical system (first illuminating (condensing) lens 41 and a second illuminating (condensing) lens 42), and is applied from a z direction to a sample 3 mounted on a sample holder 100. The electron beam transmitted through the sample 10 is imaged by an objective lens 5. A first electron beam biprism 91 is disposed on the lower side of the objective lens 5, and a second electron beam biprism 93 is disposed on the lower side of the first electron beam biprism 91 through a first imaging lens 61. An electron beam interference microscopic image having an interference stripe spacing s and an interference area width W determined by the first and second electron beam biprisms (91, 93) is adjusted to a predetermined magnification through second, third, and fourth imaging lenses (62, 63, 64), and is recorded on an observation recording surface 89 with an image observation and recording medium 79 (e.g., a TV camera or a CCD camera). Thereafter, the recorded image is reproduced, for example, in the form of an amplitude image or a phase image with an arithmetic processer 77, and is displayed, for example, on a monitor 76. A method for photographing of electron beam interference microscopic images with the apparatus illustrated in FIG. 2 and a method for reproducing amplitude images and phase images from electron beam interference microscopic images are described, for example, in PTL 5 (JP 2010-198985 A).

Figure 3:
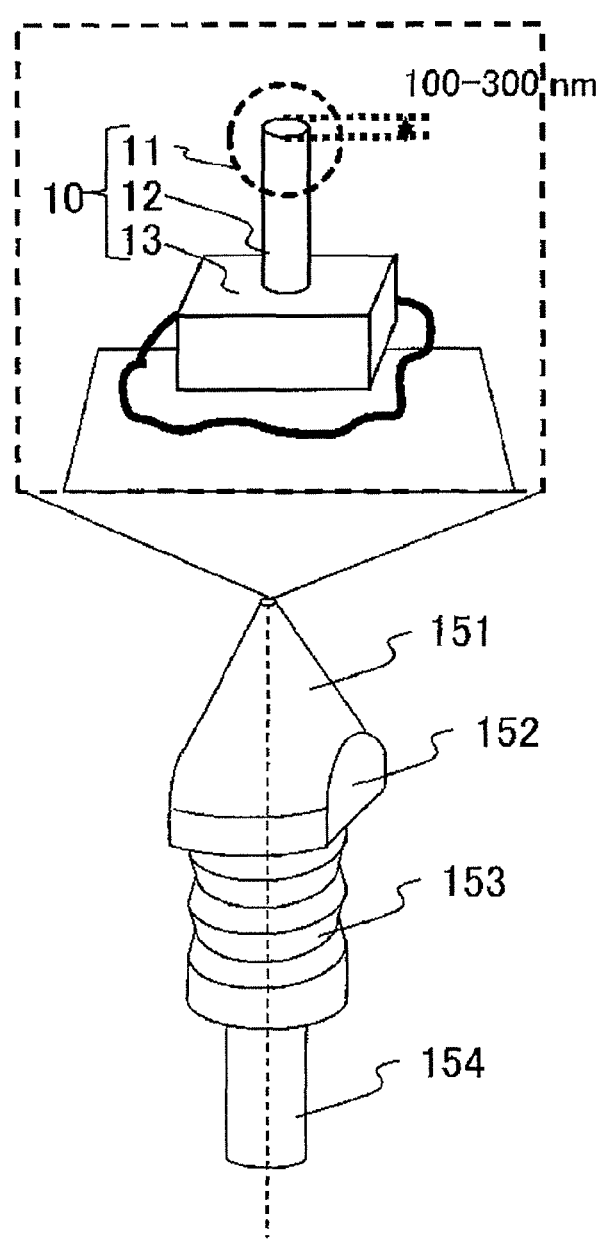
FIG. 3 is a block diagram of an acicular sample base.

FIG. 3 illustrates a shape of a sample 10 and a structure of an acicular sample base 150 on which the sample 10 is placed. The sample 10 includes a base 13 and a protrusion 12 including an observation area 11 and is placed at a tip of an acicular sample base 150. The acicular sample base 150 includes: a taper portion 151 that preferably has a taper angle of not more than 45 degrees and, in this embodiment, is conical or polygonally conical with a taper angle of 30°; a grip 152 that is used in handling the acicular sample base 150 with tweezers or the like; a screw 153 that is used for the attachment and detachment between the acicular sample base 150 and the first rotating jig 140; and a cylindrical or polygonally columnar guide 154 having a smaller diameter than the screw 153. In general-purpose tweezers, the inner side of the tip of the tweezers is planar. However, the use of specialty tweezers having a groove formed on an inner side of the top of the tweezers that is conforms to the grip 152 of the acicular sample base 150 facilitates handling of the acicular sample base 150. Further, when the acicular sample base 150 is inserted into the rotating jig 140, the insertion of the screw 153 is facilitated by preferentially inserting the guide 154 having a smaller diameter than the screw 153 into a screw hole 142.

The conical or polygonally conical shape of the acicular sample base 150 refers to such a shape that the tip on the sample side of the acicular sample base 150 is thinner than the screw 153 side. This construction can realize smooth incidence of the charged particle beams on the observation area or outgoing of the charged particle beams from the observation area through the path.

As described later in conjunction with FIGS. 4(a) and 4(b), the taper angle of the acicular sample base 150 is not more than 45° from the viewpoint of avoiding the entry of the base 13 and the acicular sample base 150 into an x-direction projection area 14 and a y-direction projection area 15 in the observation area. That is, for example, increasing the length of the protrusion 12 can allow the base 13 and the acicular sample base 150 to fall outside the projection area even when the taper angle is not less than 45°. On the other hand, when the taper angle of the acicular sample base 150 is not more than 45°, the necessity of increasing the length of the protrusion 12 can be avoided and, thus, the possibility of breaking of the sample can be reduced.

FIG. 4(a) illustrates an observation direction and an observation area 11 of the sample 10. A coordinate system xyz (that is true of other drawings) fixed to the sample 10 is set so that the angle that the major axis of the protrusion 12 makes with an x axis is +45°, the angle that the major axis of the protrusion 12 makes with a y axis is −45°, and the angle that the major axis of the protrusion 12 makes with a z axis is 90° (i.e., vertical). In order to obtain a good transmission electron image, preferably, the protrusion 12 is thin and has a diameter in the range of 100 nm to 300 nm. Further, the distance between the observation area 11 and the acicular sample base 150 should be large enough to prevent the base 13 and the acicular sample base 150 from blocking passage of incident electron beams or transmission electron beams through the light path during the capture of a rotation series of images around X axis and Y axis, that is, to prevent the base 13 and the acicular sample base 150 from falling within the x-direction projection area 14 and the y-direction projection area 15 in the observation area. When the base 13 and the acicular sample base 150 disadvantageously have fell within the projection area, this problem can also be solved by removing a portion that falls within the projection area by FIB (a focused ion beam machining system; sample machining is described in a fifth embodiment).

Figure 4:
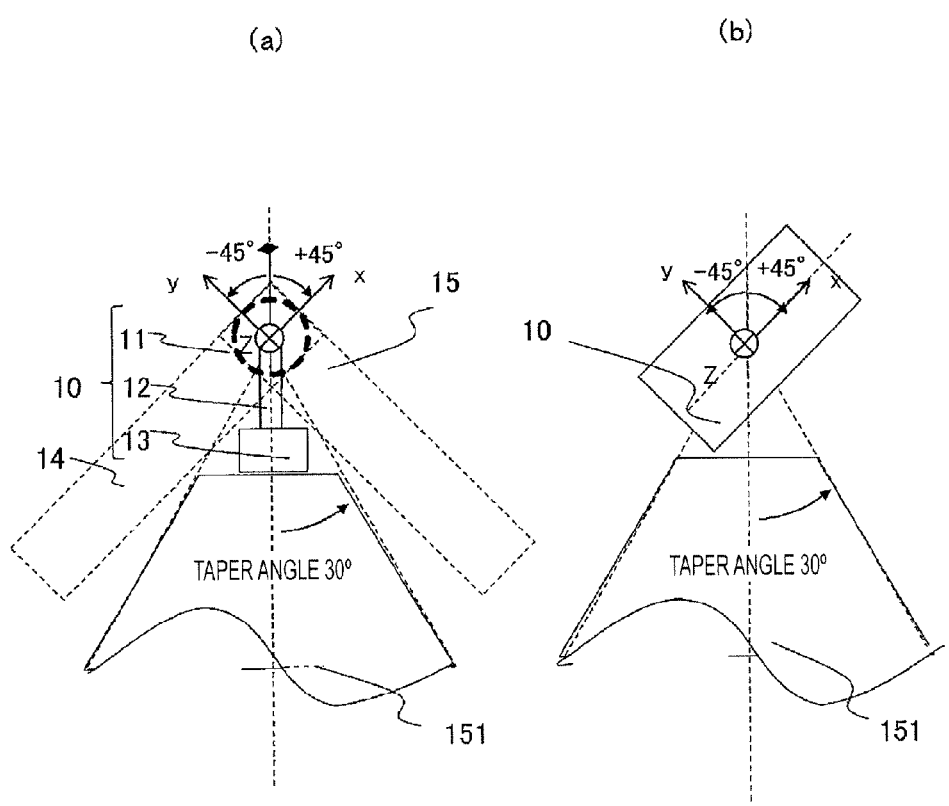
FIGS. 4(a) and 4(b) are explanatory views illustrating an observation direction and an observation area 11 of a sample, wherein 4(a) is an explanatory view of a shape close to an actual sample shape and 4 (b) is an explanatory view of a shape simplified for explanation.

In actual observation, as illustrated in FIG. 4 (a), the major axis of the protrusion 12 is set parallel to the major axis of the acicular sample base 150. In the following description, however, in explicitly illustrating the xyz direction of the sample 10, the sample 10 is illustrated by a cylinder illustrated in FIG. 4(b), that is, a cylinder of which the major axis is x axis and the minor axis is y axis.

Figure 1:
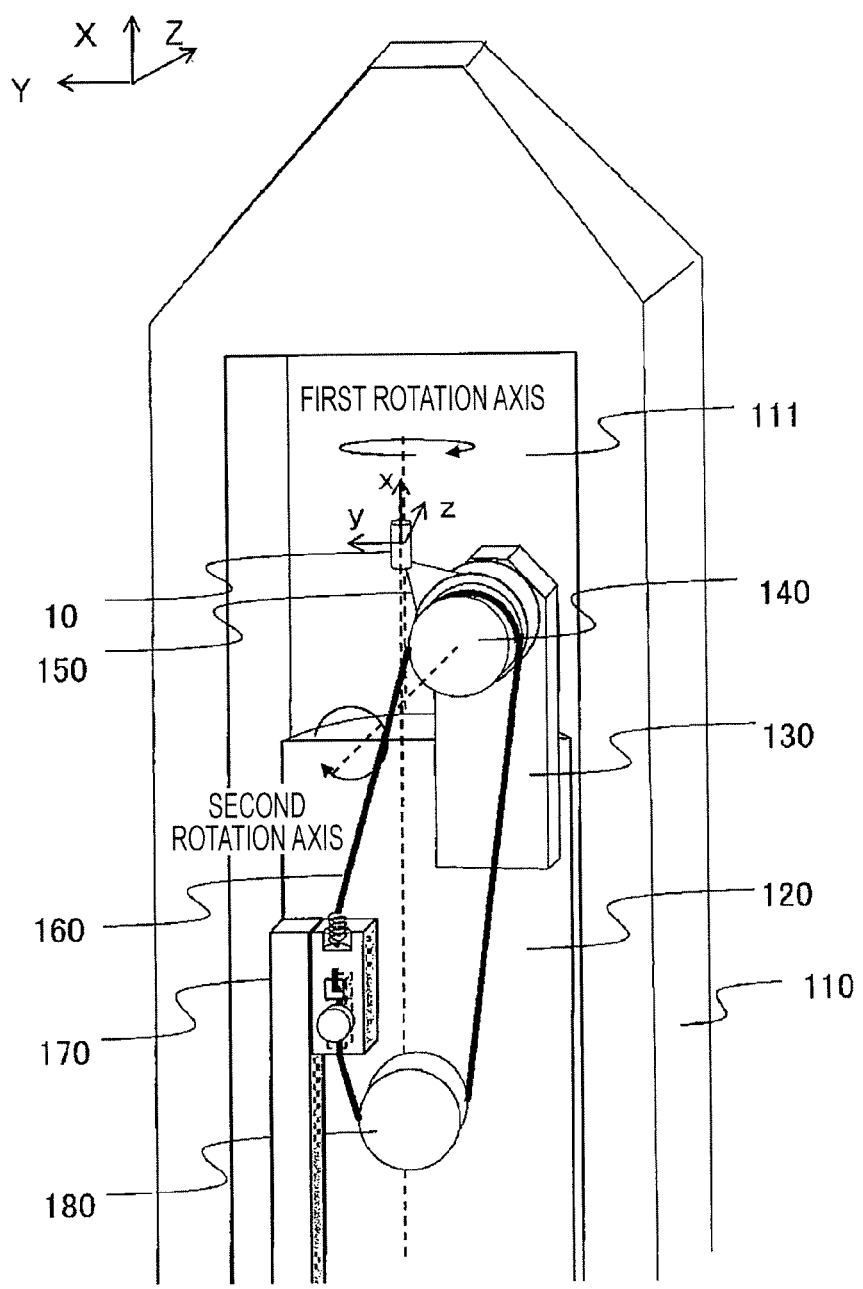
FIG. 1 is a block diagram of a sample holder used in a first embodiment.

A structure of the tip of the sample holder 100 on which the acicular sample base 150 is mounted is illustrated in FIG. 1. A coordinate system XYZ fixed to the casing (that is true of other drawings) is set so that the incident direction of the electron beam is a Z direction and the insertion direction of the sample holder 100 is an X direction. The sample holder 100 includes a holding cylinder 110, a holding rod 120 disposed within the holding cylinder, a slide jig 130 disposed at the tip of the holding rode, a first rotating jig 140 disposed at the tip of the slid jig, and the acicular sample base 150 which is provided on an outer periphery of the rotating jig and on which a sample is placed. The holding cylinder 110 has an opening 111 through which electron beams can be passed. The holding rod 120 can rotate by 360° around the first rotation axis within the holding cylinder 110 independently of the holding cylinder 110. For example, a pulse motor (not illustrated) that rotates the holding rod 120 is used in the first rotation control mechanism that regulates the rotation of the holding rod 120. The first rotating jig 140 can rotate within the holding cylinder 110 by at least 90° around a second rotation axis that is orthogonal to the first rotation axis (in this embodiment, a structure of rotation by not less than ±90° is described). A second rotation control mechanism that regulates the rotation of the first rotating jig 140 includes a wire 160 stretched on the outer periphery of the first rotating jig 140, a second rotating jig 180 on which the wire 160 is stretched, and a slid rod 170 to which a part of the wire 160 is fixed, and the first rotating jig 140 and second rotating jig 180 are rotated by moving the slide rod 170 in the x direction. For example, a linear actuator (not illustrated) is used for the movement of the slide rod 170.

Next, the function of the slide jig 130 will be described. The slide jig 130 is used for placing the sample 10 on the first rotation axis. The slide jig 130 is necessary for the following reason. In order to render x axis or y axis of the sample 10 parallel to the first rotation axis, the first rotating jig 140 is rotated to change the orientation of the sample 10. In current machining techniques, difficulties are encountered in bringing the diameter of the first rotating jig 140 to a few millimeters or less, and, when the sample 10 is rotated around the second rotation axis, the distance between the sample 10 and the first rotation axis is varied by 1 mm or more. When the sample 10 is not placed on the first rotation axis, the sample 10 is moved in a YZ plane by the rotation around the first rotation axis and, consequently, the sample 10 disadvantageously falls outside the view. A deviation of a few tens of micrometers from the view can be corrected by YZ movement of a sample stage. In the structure of the sample stage for general-purpose electron microscope, however, difficulties are encountered in moving the sample stage by 1 mm or more in the YZ direction. Accordingly, a structure is adopted in which a slide jig 130 is added and is used to move the sample 10 on the first rotation axis.

Figure 5:
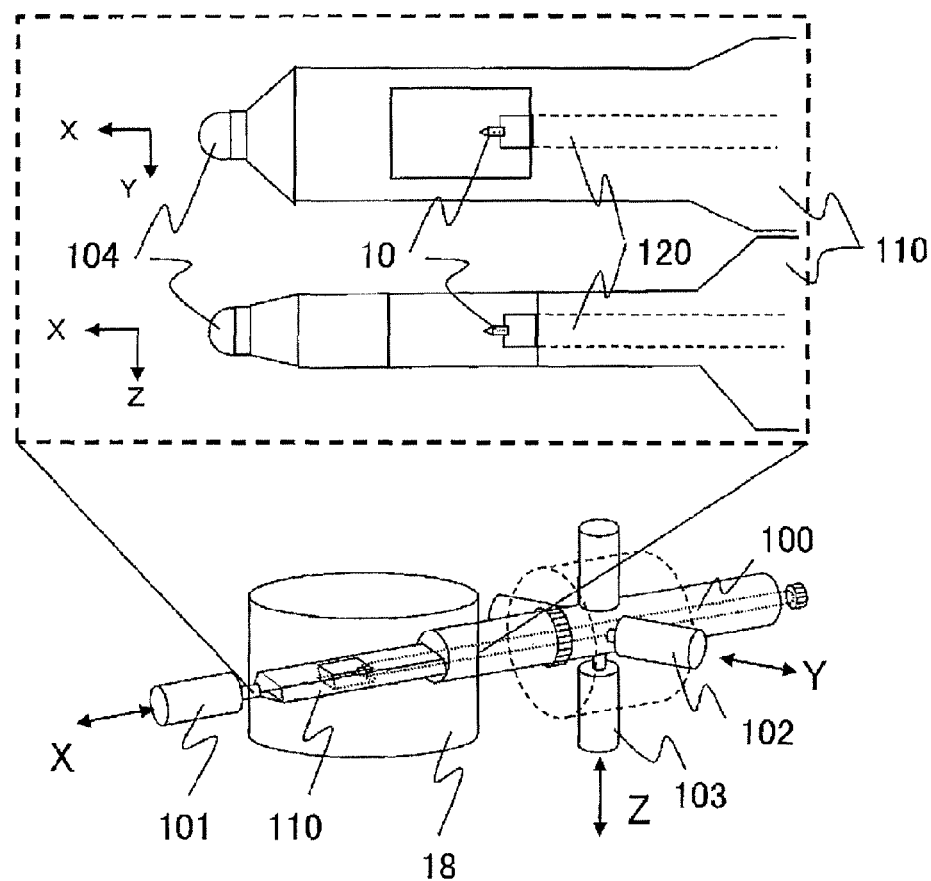
FIG. 5 is a block diagram of a sample stage.

FIG. 5 is a view for illustrating a construction of a parallel movement mechanism of a sample stage. The reason why difficulties are encountered in moving the sample 10 in the sample stage by 1 mm or more in the YZ direction will be described in conjunction with FIG. 5. The position of X, Y, and Z directions of the sample 10 is regulated with three linear actuators 101 to 103 including a pulse motor and an encoder (not illustrated). The movement of the sample 10 in the X direction can be performed by parallel movement of the whole sample holder 100 with the linear actuator 101. The movement of the sample 10 in the Y direction can be realized by providing a pivot 104 at the tip of the sample holder as a fulcrum and moving the other end of the sample holder 100 with the linear actuator 102 to the Y direction.

Accordingly, when the linear actuator 102 is operated, not only the movement in the Y direction but also inclination of the sample occurs. Also in the movement in the Z direction, since the pivot 104 at the tip of the sample holder is provided as a fulcrum and the other end of the sample holder 100 is moved by the linear actuator 103, the movement in the Z direction and inclination of the sample occur. In general-purpose sample holders, since the distance from the pivot 104 to the sample 10 is about 10 mm, when the sample is moved by 1 mm to the Y direction or the Z direction, the degree of inclination of the sample 10 is as large as sin −1(1/10)=5.70.

Tomography assumes that the rotation axis of the sample is orthogonal to the light axis of the microscope. The deviation of the rotation axis during capture of images is causative of an artifact of reconstructed images. Further, general-purpose sample stages are designed on the assumption that the sample holder 100 is inserted into an objective lens (see a seventh embodiment) and, thus, in many cases, the moving range in the X direction and the Y direction is restricted to approximately ±1 mm and the moving range in the Z direction is restricted to approximately ±0.5 mm. Thus, a major modification of the sample stage is necessary for correction of falling outside the view derived from the rotation of the sample only by the XYZ movement mechanism.

FIG. 6(a) illustrates the arrangement of components at the tip of the sample holder in the capture of a rotation series of images within a range of −180° to +180° around the x axis of the observation area. At the outset, an acicular sample base 150 with the sample 10 fixed thereon is mounted on the first rotating jig 140. The first rotating jig 140 is rotated around the second rotation axis so that the x axis in the coordinate system xyz fixed to the sample 10 is parallel to the first rotation axis (X axis), followed by sliding of the sample 10 on the first rotation axis with a slide jig 130. A rotation series of images within a range of −180° to +180° around the x axis of the observation area 11 are captured by the rotation of the sample 10 around the first rotation axis. FIG. 6(b) illustrates the arrangement of components at the tip of the sample holder in the capture of a rotation series of images within a range of −180° to +180° around the y axis of the observation area. The sample 10 is rotated around the second rotation axis to render the y axis of the sample 10 parallel to the first rotation axis (X axis), and the slide jig 130 is then used to slide the sample 10 on the first rotation axis. A rotation series of images within a range of −180° to +180° around the y axis of the observation area 11 are captured by the rotation of the sample 10 around the first rotation axis.

Each of components will be described in detail.

Figure 7:
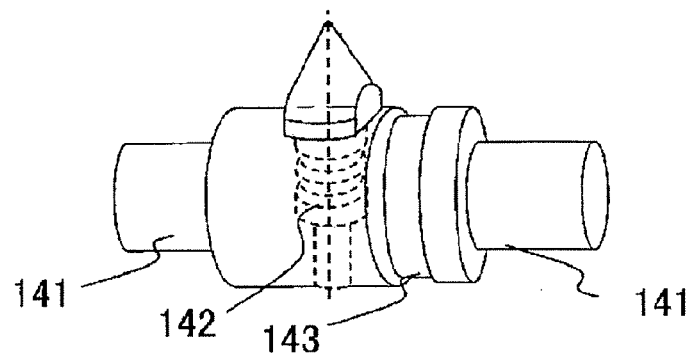
FIGS. 7(a) to 7(c) are block diagrams of a first rotating jig, wherein 7(a) illustrates a first rotating jig used in first and second embodiments, 7(b) illustrates a first rotating jig used in a third embodiment, and 7(c) illustrates a first rotating jig used in a fourth embodiment.
Figure 7:
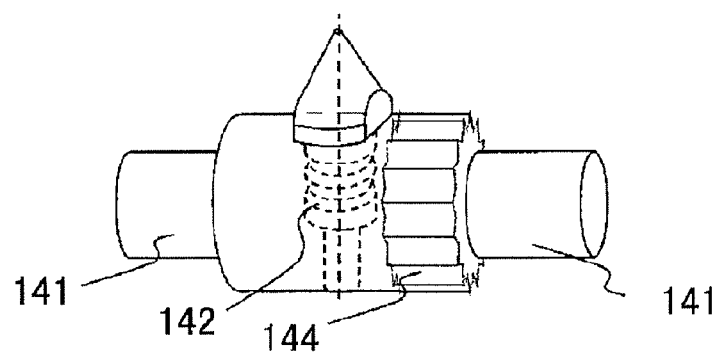
Figure 7:
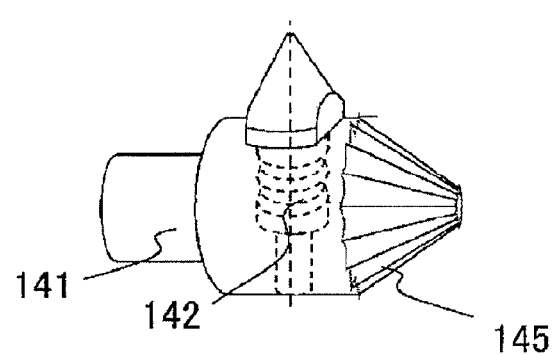
Figure 8:
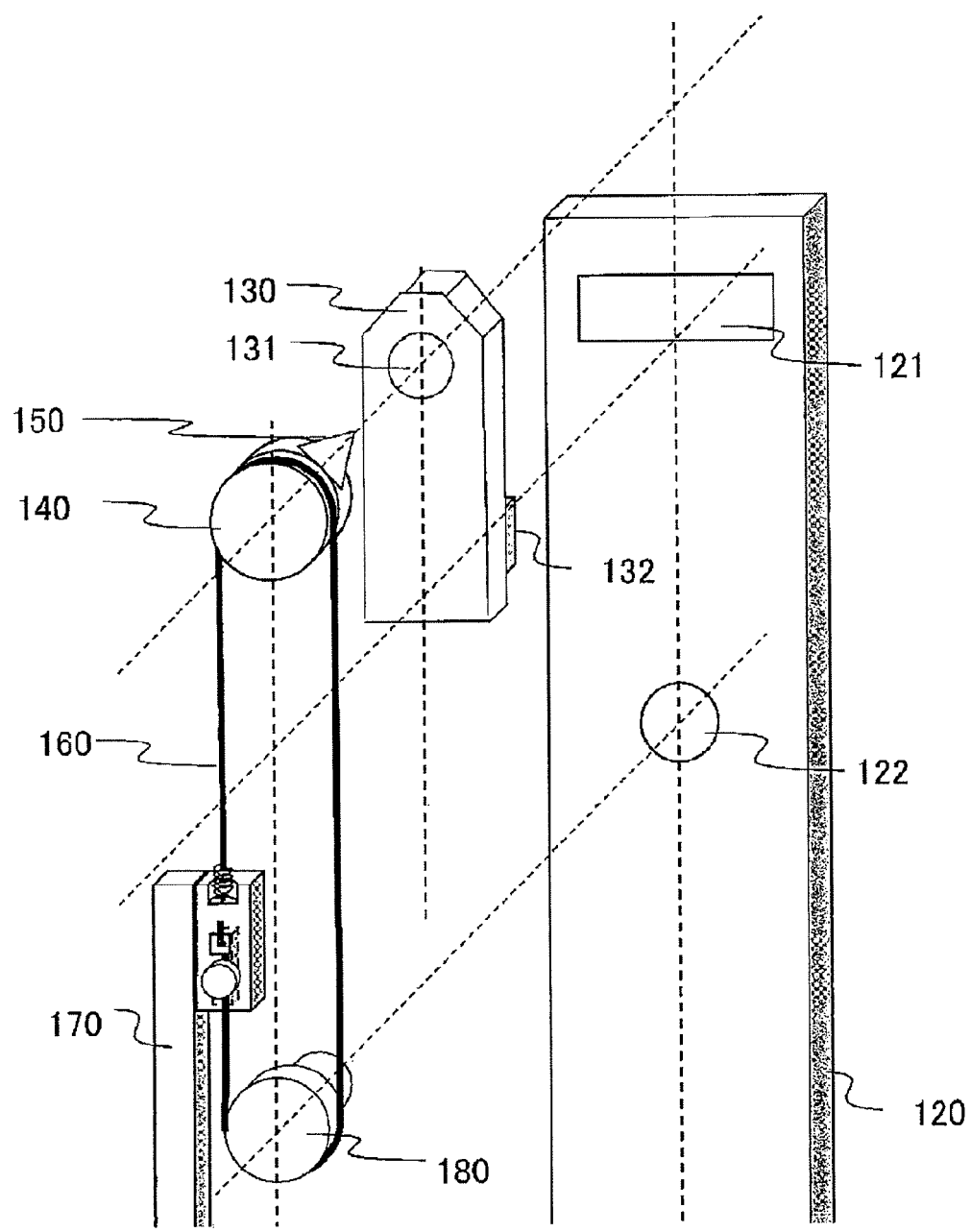
FIG. 8 is a block diagram of a sample holder used in a first embodiment.

The first rotating jig 140 includes a pivot 141 for use in the rotation axis of the rotating jig, a screw hole 142 for use in the attachment and detachment of the acicular sample base 150, and a groove 143 on which a wire is stretched (see FIG. 7(a)). The second rotating jig 180 includes a pivot 181 for use in the rotation axis of the rotating jig and a groove 183 on which a wire is stretched (see FIG. 15(a)). The slide jig 130 includes a bearing 131 that receives the pivot 141 in the first rotating jig 140 and a slide guide protrusion 132 (see FIG. 8). A supporting rod 120 includes a slide guide 121 that receives the slide guide protrusion 132, and a bearing 122 that receives the pivot 181 in the second rotating jig 180. The slide guide protrusion 132 and the slide guide 121 are in contact in a plane from the viewpoint of keeping the angle between the slide jig 130 and the supporting rod 120 constant. Design is made so that the sample is disposed on the first rotation axis when the slide guide protrusion 132 is brought into contact with the right end of the slide guide 121 at a rotating jig angle θ2 of 0° (see FIG. 9(a)) and when the slide guide protrusion 132 is brought into contact with the left end of the slide guide 121 at a rotating jig angle θ2 of 90° (see FIG. 9(b)).

As can be seen from FIGS. 9(a) to 9(d), the path of the wire 160 is varied by moving the slide jig 130. Accordingly, preferably, a method is adopted in which an elastic member is mounted on the wire 160 to prevent loosening or breaking of the wire. In an example, a construction is adopted in which one end of the wire 160 is connected to an elastic portion 161 (here a spring material) and the elastic portion 161 is connected to a slide rod 170 (see FIG. 10). Further, the other end of the wire 160 is passed through a hole 171 provided in the slide rod to closely regulate the length of the wire 160 and wire 160 is then held with a wire pressing screw 172.

Figure 11:
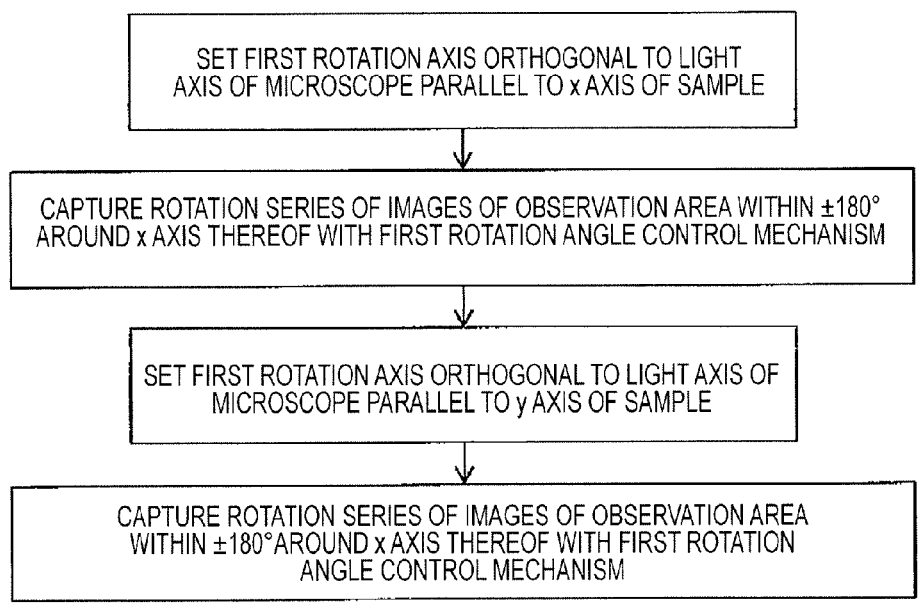
FIG. 11 is a flow chart for the capture of a rotation series of images of a sample around x axis and y axis.

Finally, the procedure of the capture of images will be described. The procedure of the capture is configured with four steps illustrated in FIG. 11. (a) The first rotation axis orthogonal to a light axis of a microscope is set parallel to the x axis of the sample. (b) A rotation series of images of an observation area within a range of −180° to +180° around the x axis thereof is captured with a first rotation angle control mechanism. (c) The first rotation axis is set parallel to the y axis of the sample. (d) A rotation series of images of an observation area within a range of −180° to +180° around the y axis thereof is captured with a first rotation angle control mechanism.

At the outset, the procedure of step (a) will be described. Step (a) starts with such a state that a sample 10 is mounted on the sample holder 100. The first rotating jig 140 is rotated around the second rotation axis so that the angle between the major axis of the acicular sample base 150 and the first rotation axis is approximately −45°. The sample 10 is moved substantially on the first rotation axis with the slide jig 130, and the sample holder 100 is then inserted into a sample chamber. The position of the sample 10 within the sample chamber is confirmed, and, at the outset, the second rotation axis is adjusted so as to be parallel to the light axis of the microscope. In the sample 10 thus adjusted, the xyz direction fixed to the sample 10 is identical to the XYZ direction fixed to a casing. In this case, the rotation angle θ1 of the supporting rod 120 is 0°, and the rotation angle θ2 of the first rotating jig 140 is 0°. When transmission images of the sample 10 are captured at several magnifications, these images can be used later for confirmation when the y axis of the sample 10 is set parallel to the first rotation axis. In step (b), the supporting rod 120 is rotated around the first rotation axis, and a rotation series of images of an observation area within a range of −180° to +180° around the x axis are captured.

Next, the procedure of step (c) is described. The sample holder 100 is taken out of the sample chamber, and the first rotating jig 140 is rotated by approximately 90° around the second rotation axis so that the angle between the major axis of the acicular sample base 150 and the first rotation axis is substantially +45°. The sample 10 is moved substantially on the first rotation axis by using the slide jig 130, and the sample holder 100 is inserted into the sample chamber. In this embodiment, the movement of the slide jig 130 is carried out outside the sample chamber. The reason for this is that a mechanism that moves the slide jig 130 within the sample chamber is omitted to ensure a space within the sample chamber. That is, when the space provided can be ensured, the movement of the slide jig 130 may be carried out within the sample chamber. After the position of the sample 10 within the sample chamber is confirmed, as with the step (a), adjustment is made so that the second rotation axis is parallel to the light axis of the microscope. Fine adjustment is then made with the second rotation control mechanism so that the y axis of the sample 10 is parallel to the first rotation axis. In the fine adjustment, while an image captured at θ1=0° and θ2=0° is used as a reference image, the rotation angle of the image under current setting conditions is measured by image processing, and θ2 is adjusted to 90°. This fine adjustment may also be carried out with an optical microscope outside the sample chamber. When the sample holder is transferred into and from the sample chamber, there is a possibility that the arrangement of each component at the tip of the sample holder is disadvantageously deviated. Immediately before the capture of a rotation series of images, the fine adjustment is preferably carried out within the sample chamber. After the fine adjustment, in step (d), the supporting rod 120 is rotated around the first rotation axis, and a rotation series of images of an observation area within a range of −180° to +180° around the x axis is captured.

A technique that reconstructs a three-dimensional magnetic field structure of the observation area from the rotation series of images of within a range of −180° to +180° around the x axis and the rotation series of images of within a range of −180° to +180° around the y axis is described, for example, in NPL 1. NPL 1 illustrates a technique that reconstructs a three-dimensional magnetic field structure using a rotation series of phase images reproduced from a Lorentz image. The same technique can be applied to a rotation series of phase images reproduced from electron beam interference microscopic images. Further, the present invention can be used in other analytical methods in which a three-dimensional structure of the observation area is analyzed from the rotation series of images within a range of −180° to +180° around the x axis and the rotation series of images of within a range of −180° to +180° around the y axis other than vector field tomography.

Second Embodiment

Figure 12:
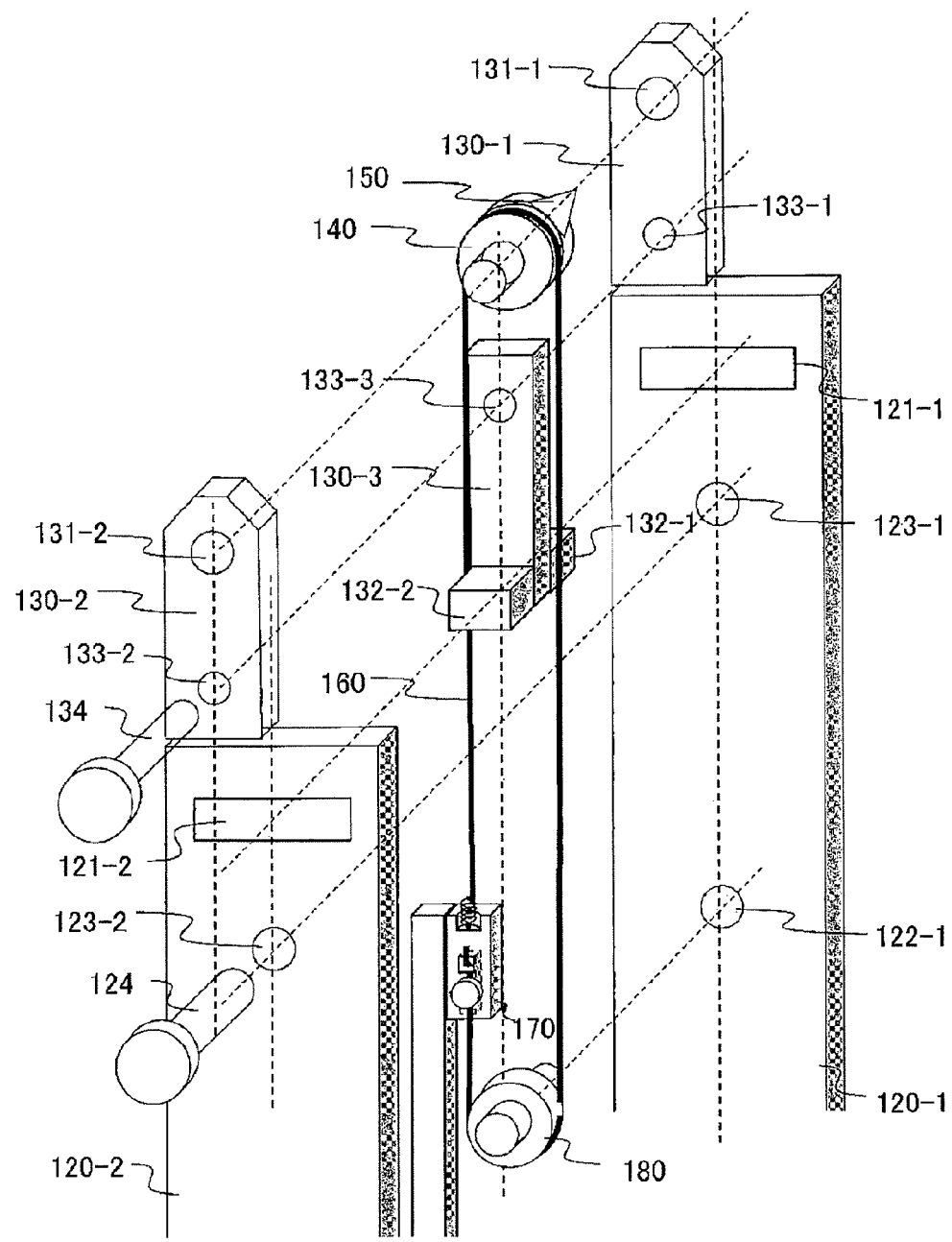
FIG. 12 is a block diagram of a sample holder used in a second embodiment.

The sample holder used in the first embodiment has a construction including a minimum necessary number of components. In the second embodiment, from the viewpoint of improving the controllability of the rotation angle, a sample holder that is illustrated in FIG. 12 and is the same as the sample holder used in the first embodiment except that several components are added is used. Components other than the sample holder, that is, the observation sample, electron beam interference microscope and the like, are the same as those in the first embodiment and, thus, detailed description will be omitted.

At the outset, FIG. 1 illustrates a structure in which the pivot 141 in the first rotating jig 140 is inserted into the bearing 131 in the slide jig 130. By contrast, FIG. 12 illustrates a structure in which the slide jig 130 is divided into a plurality of components 130-1, 130-2, and 130-3 and the first rotating jig 140 is held between the components. The slide jigs 130-1 and 130-2 respectively have bearings 131-1 and 131-2 receiving a pivot 141 in the first rotating jig 140 and hold the first rotating jig 140 therebetween. A slide jig 130-3 that specifies a distance between the slide jigs 130-1 and 130-2 is provided between the slide jigs 130-1 and 130-2. A screw hole 133-1 is provided in the slide jig 130-1, and holes 133-2 and 133-3 are provided in the slide jigs 130-2 and 130-3, respectively. The slide jig 130 can be assembled with a screw 134. Thus, holding of the rotating jig 140 from both sides thereof can reduce a possibility of dropping of the first rotating jig 140 from the slide jig 130 in FIG. 1. Further, providing the bearings 131-1 and 131-2 can prevent inclination of the rotation axis of the rotating jig 141, that is, the second rotation axis, due to tension of the wire 160 that makes it impossible to render the first rotation axis orthogonal to the second rotation axis.

A supporting rod 120 is also divided into a plurality of components 120-1 and 120-2, and the slide jig 130 is held from both sides thereof by the components 120-1 and 120-2. Slide guides 121-2 and 121-2 are provided on the supporting rods 120-1 and 120-2, respectively, and slide protrusions 132-1 and 132-2 corresponding respectively to the slide guides 121-2 and 121-2 are provided on the slide jig 130-3. Further, a screw hole 123-1 is provided in the supporting rod 120-1, and a hole 123-2 is provided in the supporting rod 120-2. Assembling may be carried out with a screw 124. Design is made so that the sample is disposed on the first rotation axis when the angle θ2 of the rotating jig is 0°, the slide protrusion 132 is brought into contact with the right end of the slide guide 121 while, when the angle θ2 of the rotating jig is 90°, the slide protrusion 132 is brought into contact with the left end of the slide guide 121. After the screw 124 is loosened to move the slide jig 130, the screw 124 is fastened to specify the position of the slide jig 130. The slide guide protrusion 132 and the slide guide 121 are in contact with each other in a plane so that, even when the supporting rod slide jig 130 is moved, the angle between the slide jig 130 and the supporting rod 120 is kept constant. Further, the lower surface of the slide jigs 130-1 and 130-2 and the upper surface of the supporting rods 120-1 and 120-2 are in contact with each other in a plane. This also functions to keep the angle between the slide jig 130 and the supporting rod 120 constant.

The structure is the same as the structure in the first embodiment except for the structure of the rotating jig, the slide jig, and the supporting rod, and, thus, the description of the procedure of capture of images will be omitted.

Third Embodiment

In the third embodiment, a case example will be described where a saliently machined sample is mounted on the sample holder illustrated in FIGS. 14(a) to 14(d) and a rotation series of images of an observation area within a range of −180° to +180° around the x axis thereof and a rotation series of images of an observation area within a range of −180° to +180° around the y axis thereof are captured under an electron beam interference microscope. The components other than the sample holder, that is, the sample to be observed, the electron beam interference microscope and the like, are the same as those in the first embodiment.

Figure 13:
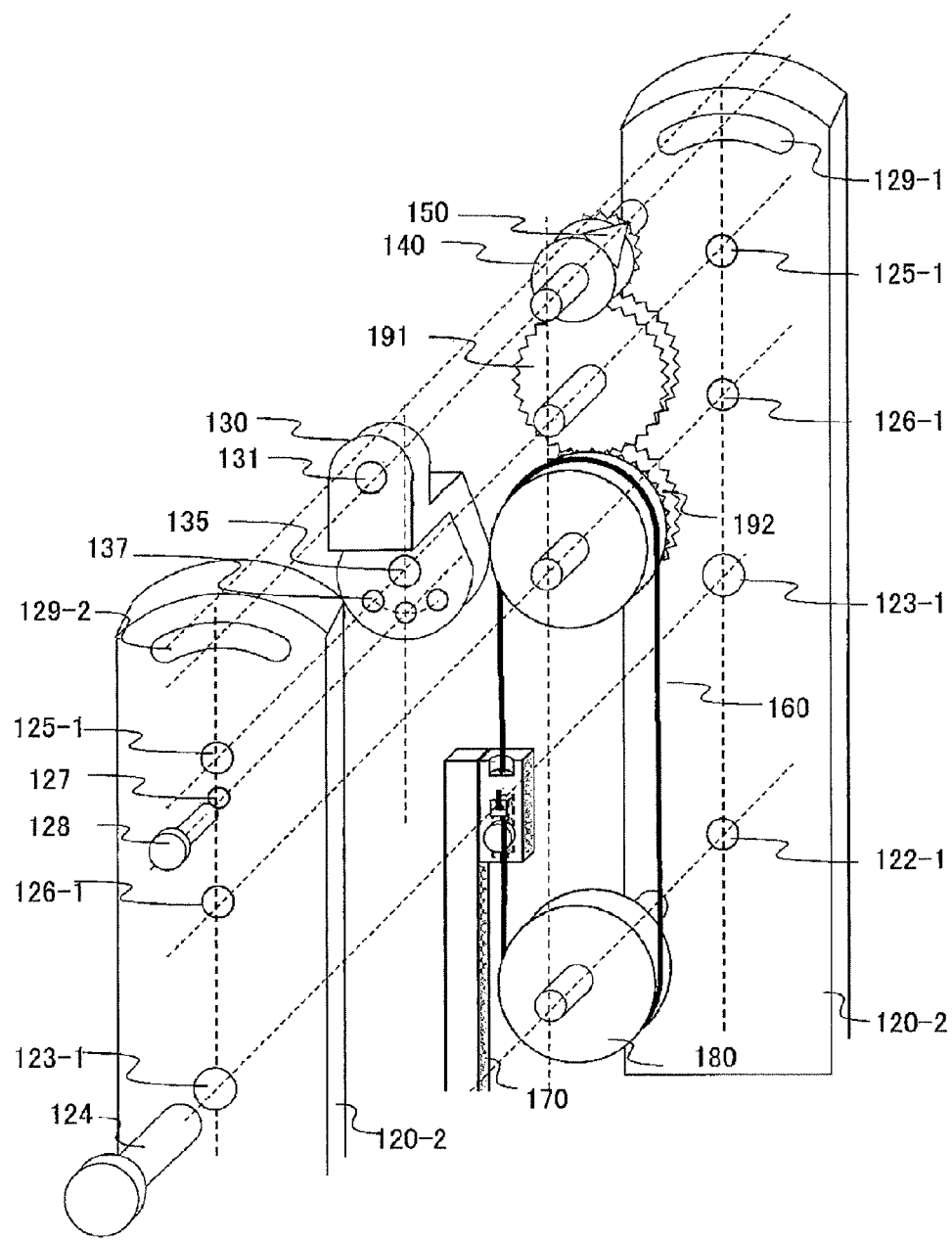
FIG. 13 is a block diagram of a sample holder used in a third embodiment.
Figure 14:
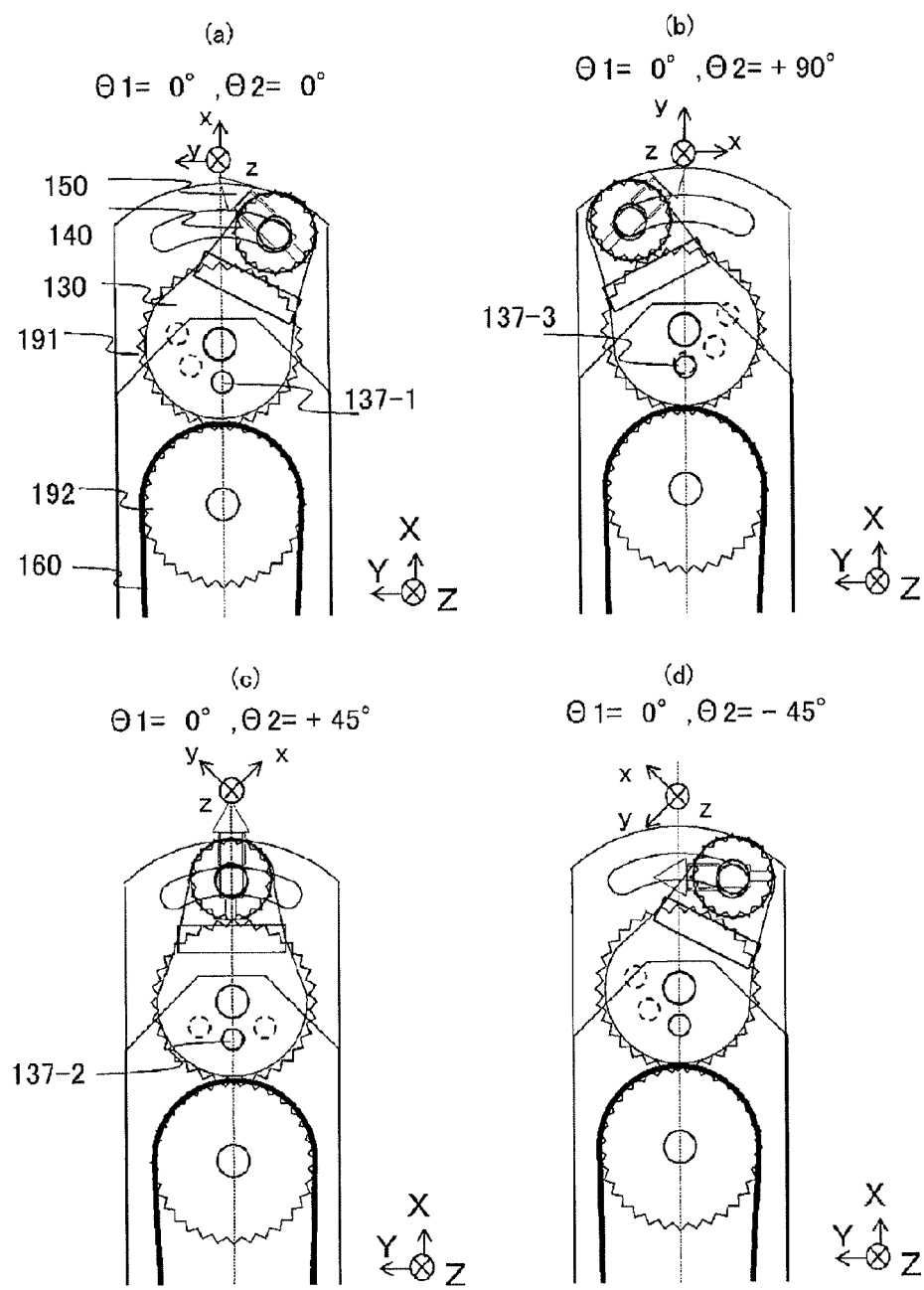
FIGS. 14(a) 14(d) are block diagrams of a sample holder used in a third embodiment, wherein 14(a) illustrates a block diagram of an arrangement of each component in the capture of a rotation series of images of a sample around x axis, 14(b) illustrates a block diagram of an arrangement of each component in the capture of a rotation series of images of a sample around y axis, 14(c) illustrates a block diagram of an arrangement of each component in the observation of a sample with the sample inserted into a narrow gap lens, and 14(d) illustrates a block diagram of an arrangement of each component in use in a sample machining apparatus.

In the first and second embodiments, a structure in which the first rotating jig 140 is rotated with a wire 160 stretched on the outer periphery of the first rotating jig 140 was adopted. By contrast, in the structure illustrated in FIGS. 14(a) to 14(d), a structure is adopted in which the first rotating jig 140 is rotated with a gear rather than the wire 160. Specifically, a first gear 144 is provided on the outer periphery of the first rotating jig 140 (see FIG. 7(b)). Further, this structure uses a third rotating jig 191 (see FIG. 13(a)) having a third gear 191-2 that has been worked so as to engage with the first gear 144, and a fourth rotating jig 192 (see FIG. 13(b)) having a fourth gear 192-2 worked so as to engage with the third gear 191-2. A groove 192-3 on which the wire 160 is stretched is provided on the fourth rotating jig 192. The wire 160 is stretched on the fourth rotating jig 192 and the second rotating jig 180, and the fourth rotating jig 192 and the second rotating jig 180 are rotated by moving, to an X direction, a slide rod 170 to which a part of the wire 160 is fixed. The rotation of the fourth rotating jig 192 rotates the third rotating jig through the gear, and, consequently, the first rotating jig 140 is rotated. According to this construction, when the radius of the first rotating jig 140 is very small, the radius of curvature of the wire 160 stretched on the first rotating jig 140 is high, contributing to a reduction in a possibility of breaking of the wire 160.

Individual components will be described in detail.

The slide jig 130 has a bearing 131 that receives the pivot 141 of the first rotating jig 140, a bearing 135 that receives the pivot of the third rotating jig 191, and a guide hole 137. The supporting rod 120 includes a slide bearing 129 that receives a pivot 141 of the first rotating jig 140 and slides the position of the pivot, a bearing 122 that receives a pivot 181 of the second rotating jig, a bearing 125 that receives a pivot 191-1 of the third rotating jig 191, a bearing 126 that receives a pivot 192-1 of the fourth rotating jig 192, and a guide hole 127. Design is made so that the sample 10 is disposed on the first rotation axis when the angle θ2 of the rotating jig 140 is 0°, the pivot 141 of the first rotating jig 140 is brought into contact with the right end of the bearing 129 (see FIG. 14(a)) while, when the angle θ2 of the rotating jig 140 is 90°, the pivot 141 of the second rotating jig 140 is brought into contact with the left end of the bearing 129 (see FIG. 14(b)). In the sample holder in this embodiment, the position of the slide jig 130 cannot be specified with a screw. Accordingly, the position of the slide jig 130 is specified by passing the guide pin 128 through a guide hole 127-1 of the supporting rod 120 and a guide hole 137 of the slide jig 130.

In the arrangement of FIG. 12 (a) (θ2=0°), the slide pin 128 is passed though the guide hole 137-1, and, in the arrangement of FIG. 12 (b) (θ2=90°), the slide pin 128 is passed through the guide hole 137-3, and, in the arrangement of FIG. 12 (c) (θ2=45°), the slide pin 128 is passed through the guide hole 127-2.

The structure is the same as in the first embodiment except for the structure of the rotating jig, the slide jig, and the supporting rod, and, thus, the description of the procedure of capture of images and the like will be omitted.

Fourth Embodiment

Figure 16:
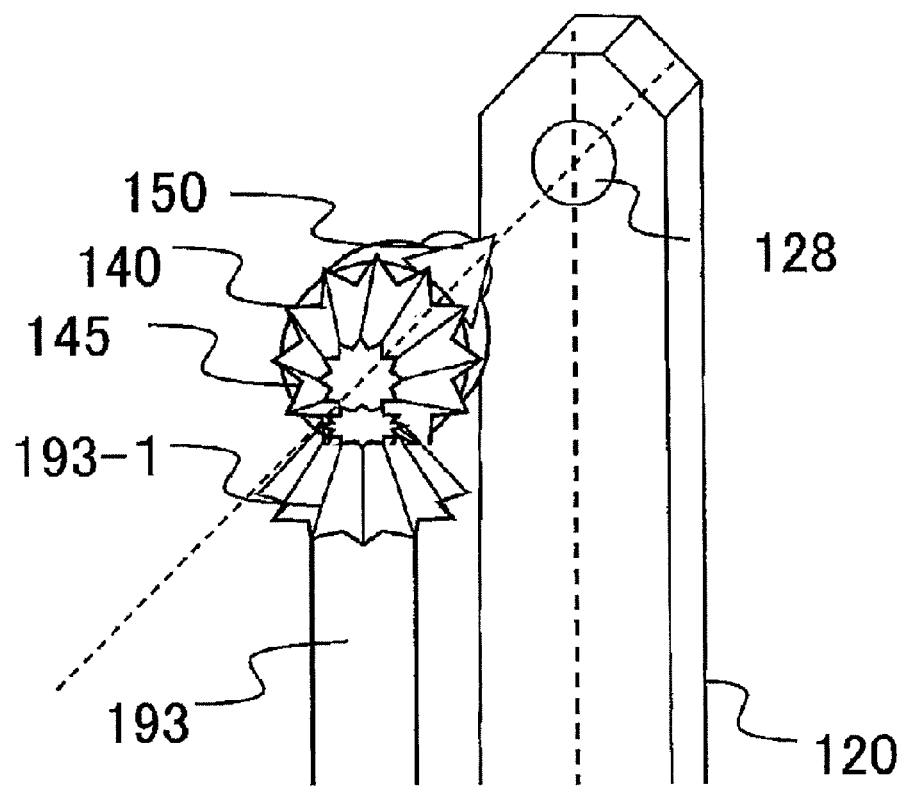
FIG. 16 is a block diagram of a sample holder used in a fourth embodiment.

In the fourth embodiment, a case example is described in which a saliently worked sample is mounted on a sample holder illustrated in FIG. 16, and a rotation series of images of an observation area within a range of −180° to +180° around the x axis thereof and an observation area within a range of −180° to +180° around the y axis thereof are captured under an electron beam interference microscope. The components other than the sample holder that is, the observation sample, the electron beam interference microscope and the like are the same as those in the first embodiment.

In the first, second, and third embodiments, the use of a sample stage illustrated in FIG. 5, that is, a sample stage in which the Y micromotion range and Z micromotion range are restricted to ±1 mm or less, is contemplated, and a sample holder having an additional function of providing a sample 10 on the first rotation axis with a slide jig 130 is used. Regarding another structure, when a sample stage is used in which the Y micromotion range and Z micromotion range are ±1 mm or more, the structure of the tip of the sample holder can be simplified as illustrated in FIG. 16. FIG. 16 is an example in which the first rotating jig 140 is rotated with an umbrella gear. This includes a first gear 145 worked on the outer periphery of the first rotating jig 140 (see FIG. 7(c)), a fifth rotating jig 193 having a fifth gear 193-1 provided so as to engage with the first umbrella gear 145, and a motor (not illustrated) that rotates the fifth rotating jig 193. The fifth rotating jig 193 is rotated by the motor, and the first rotating jig 140 is rotated by this rotation. The structure is the same as that in the first embodiment except for the structure of the rotating jig, the slide jig, and the supporting rod, and, thus, the description of the procedure of capture of images is omitted.

Fifth Embodiment

Figure 18:
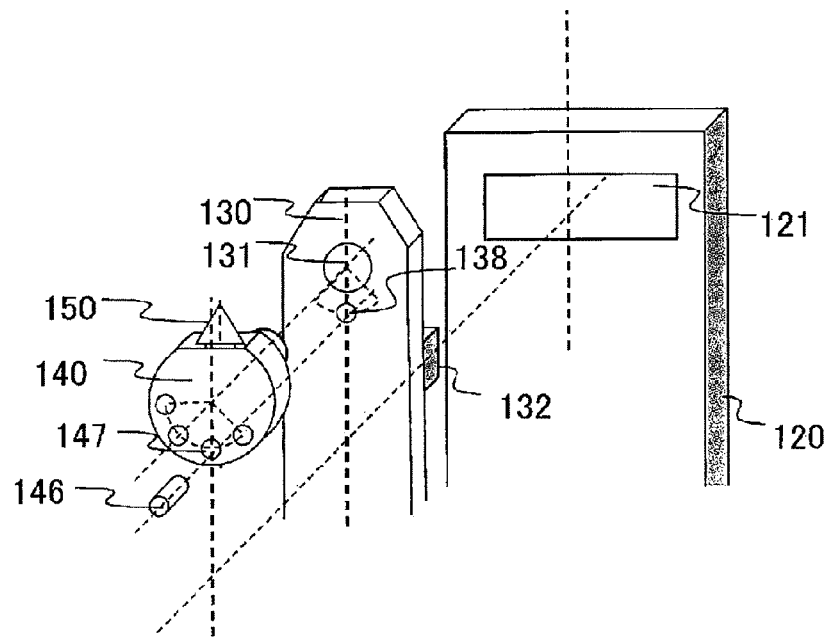
FIG. 18 is a block diagram of a sample holder used in a fifth embodiment.
Figure 19:
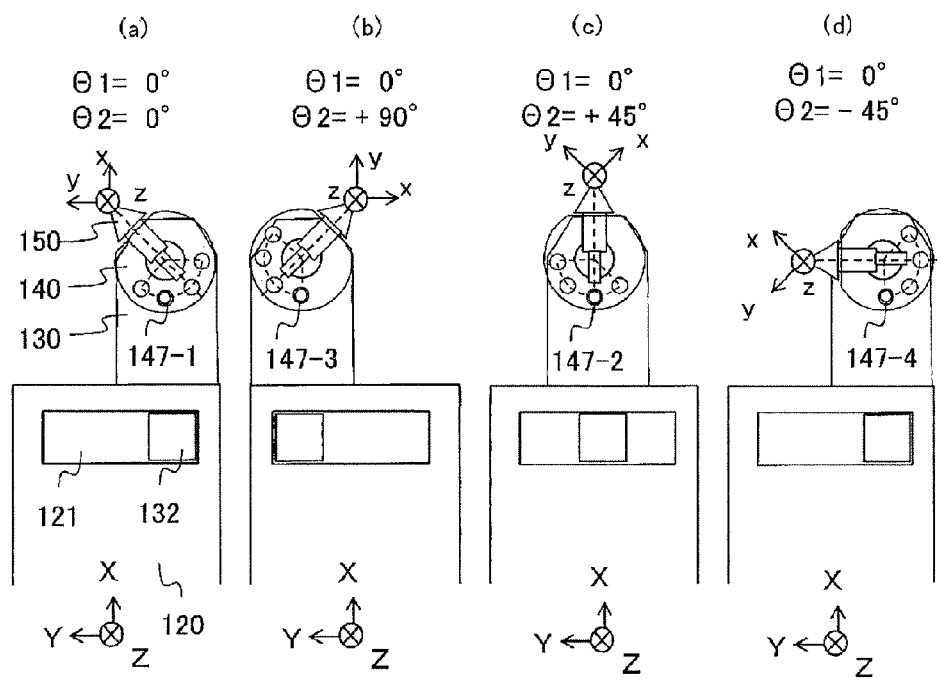
FIGS. 19(a) to 19(d) are block diagrams of a sample holder used in a sixth embodiment, wherein 19(a) illustrates a block diagram of an arrangement of each component in the capture of a rotation series of images of a sample around x axis, 19(b) illustrates a block diagram of an arrangement of each component in the capture of a rotation series of images of a sample around y axis, 19(c) illustrates a block diagram of an arrangement of each component in the observation of a sample with the sample inserted into a narrow gap lens, and 19(d) illustrates a block diagram of an arrangement of each component in use in a sample machining apparatus.

In a fifth embodiment, a case example is described in which a saliently worked sample is mounted on a sample holder illustrated in FIG. 18 and a rotation series of images of an observation area within a range of −180° to +180° around the x axis thereof and an observation area within a range of −180° to +180° around the y axis thereof are captured under an electron beam interference microscope. The components other than the sample holder, that is, the observation sample, the electron beam interference microscope and the like, are the same as those in the first embodiment.

In the sample holder illustrated in the first, second, third, and fourth embodiments, a second rotation control mechanism can be used to finely adjust the rotation angle θ2 around the second rotation axis of the first rotating jig 140. However, as long as a necessary angle setting accuracy is obtained, a method can be adopted in which a sample holder in which θ2 has been set outside the sample chamber is inserted into the sample chamber and, in this state, a rotation series of images are captured. For example, when the sample holder illustrated in FIG. 18 is used, θ2 is set by passing a guide pin 146 through a guide hole 147 provided in the rotation axis 140 and a guide hole 137 provided in the slide jig 130. As shown in FIGS. 19(a) to 19(d), for setting to a predetermined angle, the guide pin 146 can be passed through a guide hole 147-1 when θ2 is 0°; through a guide hole 147-3 when θ2 is 90°; through a guide hole 147-2 when θ2 is +45°; and through a guide hole 147-4 when θ2 is −45".

The method by which the rotation angle θ2 of the first rotating jig is set with the guide pin 146 can be utilized in a structure in which the first rotating jig 140 is held from both sides thereof (not illustrated). Further, in FIG. 18, a plurality of guide holes 147 are provided in the first rotating jig 140, and one guide hole 137 is provided in the side jig 130. Alternatively, the same setting may be carried out in a construction in which one guide hole 147 is provided in the first rotating jig 140 and a plurality of guide holes 137 are provided in the slide jig 130.

In the sample holder in this embodiment, very small components are used, and, thus, the proportion of crossing with respect to component size is considered to be large. When an angle error of θ2 of not more than 1° is intended, in some cases, preferably, θ2 is finely adjusted with a second rotation control mechanism illustrated in the first, second, third, fourth embodiments. When this embodiment is applied, however, a method can be adopted in which a sample holder in which θ2 has been set outside the sample chamber is inserted into the sample chamber, and, in this state, a rotation series of images are captured.

Sixth Embodiment

In a sixth embodiment, a case example will be described in which a sample holder illustrated in the first, second, third, fourth, and fifth embodiments is used and a sample is saliently machined with a sample machining apparatus illustrated in FIG. 20.

Figure 20:
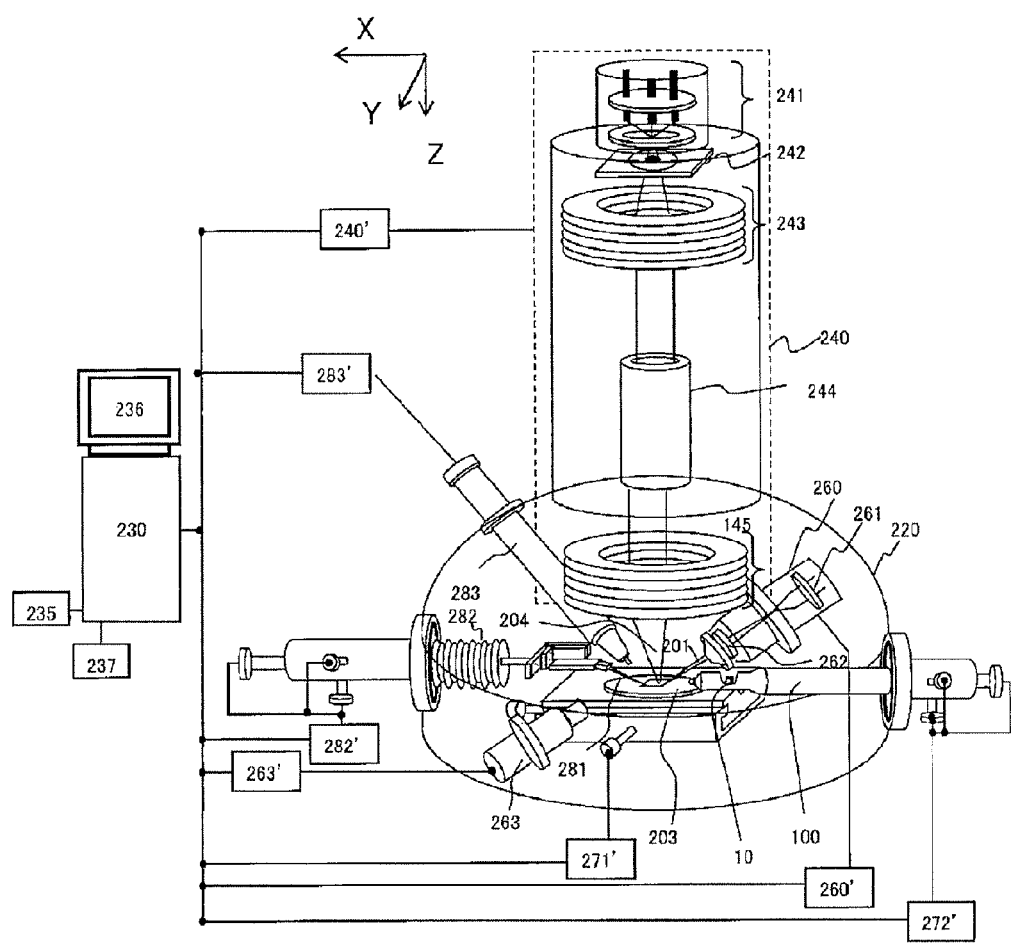
FIG. 20 is a block diagram of an ion beam machining apparatus.

FIG. 20 is a block diagram of an ion beam machining apparatus (hereinafter abbreviated to FIB). The ion beam machining apparatus includes an ion beam illuminating optical system 240 that irradiates a wafer sample 203 such as a semiconductor wafer or a semiconductor chip with ion beams 204, a wafer sample stage 271 on which a wafer sample 203 is mounted and which moves the wafer sample 203 in its area to be machined to an ion beam irradiation area, a wafer sample position control unit 271' that regulates the position of the wafer sample stage 271, a probe drive unit 282 that holds and moves a probe 281, a probe drive control unit 182' that regulates the probe drive unit 282, a sample holder 100 on which a sample 10 extracted from the wafer 203 is placed, a sample holder position control unit 272' that regulates the position of the sample holder 100, a deposit gas supply source 283 that supplies a deposition gas (a deposit gas) to a position around an observation area of the wafer sample 203 and the sample 10, a deposit gas supply control unit 283' that regulates the deposit gas supply source 283, an electron beam illuminating optical system 260 that irradiates the wafer sample 203 and the sample 10 with a primary electron beam 201, and a secondary electron detector 263 that detects a secondary electron 202 released from the wafer sample 203 and the sample 10.

A rotation mechanism in an XY plane is provided in the wafer sample stage 271 for placing the wafer sample 203 in a predetermined direction. The ion beam illuminating optical system 240, the wafer sample stage 271, the sample holder 100, the probe drive unit 282, the deposit gas supply source 283, the electron beam illuminating optical system 260, and the secondary electron detector 283 are disposed within a vacuum vessel 220 that is highly evacuated. The control computer 230 performs the regulation of the whole ion beam machining apparatus. To this end, the control computer 230 includes a storage unit 235 that stores software which regulates each connected component, a user interface 237 that allows a user to input setting parameters of the apparatus, and a display unit 236 that displays various operation screens and SEM images. The procedure of machining a sample is described, for example, in PTL 6 (JP 3547143 B1).

The sample holder 100 illustrated in the first, second, third, fourth, and fifth embodiments is designed so as to be commonly used without the necessity of attaching and detaching a sample even in FIB. The arrangement of each of components at the tip of the sample holder in the first embodiment in machining a sample in FIB is shown in FIG. 6(c) and FIG. 9(d). At the outset, an acicular sample base 150 is mounted on a first rotating jig 140, and the first rotating jig 140 is rotated so that the major axis of the acicular sample base 150 is orthogonal to the X axis (a sample holder insertion direction), that is, so that the angle θ2 of the first rotating jig 140 is substantially −45°. The slide jig 130 is moved to a right end in FIG. 9(d) so that the tip of the acicular sample base 150 reaches a position on the first rotation axis. Even when the slide jig 130 is moved, the sample 10 cannot be placed on the first rotation axis. However, the distance between the sample and the first rotation axis is approximately 0.5 mm, and the sample 10 can be moved to a lens focal point by regulating the Z position of the sample holder 100. The sample holder 100 set in this way is inserted into a FIB casing.

Before machining the sample, a necessary distance between the acicular sample base 150 and an observation area 11 is estimated. As described in the first embodiment in conjunction with FIGS. 4(a) and 4(b), a satisfactory distance is provided between the observation area 11 and the acicular sample base 150 so that the acicular sample base 150 does not block a light path of incident electron beams or transmitted electron beams during the capture of a rotation series of images of an observation area around the x axis and the y axis. In order to estimate the necessary distance, at the outset, in such a state that the major axis of the acicular sample base 150 is orthogonal to the light axis of FIB (θ1=0°), the tip of the acicular sample base 150 is observed, the radius of the tip of the acicular sample base 150 is measured, and a necessary distance between the observation area 11 and an acicular sample 150 observation area is calculated. The distance should be at least a value or more obtained by multiplying the radius of the tip by tan(45°). In this embodiment, the distance is a value obtained by multiplying the radius of the tip by tan(60°). A sample 10 is taken off from the wafer sample so that the distance between the observation area 11 and the acicular sample 150 observation area is the calculated value. The size of the sample 10 is generally a few tens of micrometers. Therefore, when the distance between an observation view 11 and the acicular sample base 150 should be a few tens of micrometers or more, a method may be adopted in which a substrate chip having a suitable size is fixed to the tip of the acicular sample base 150 to previously separate the tip of the acicular sample base 150 from the sample 10.

Next, a sample chip is fixed to the tip of the acicular sample base 150. In fixing the sample chip, the tip of the sample holder is set as illustrated in FIG. 6(d). The supporting rod 120 is rotated so that the major axis of the acicular sample base 150 is substantially parallel to the Z axis (light axis of FIB), that is, so that the rotation angle θ1 of the supporting rod 120 is substantially −90°. The upside of the acicular sample base 150 is opened by rotating only the supporting rod 120 without rotating the holding cylinder 110. The sample 10 is fixed to the tip of the acicular sample base 150, and the protrusion is roughly machined. Before thinning of the protrusion, the supporting rod 120 is rotated to set θ1 to 0°, and whether or not the acicular sample base 150 and the sample base 12 block the light path of incident electron beams or transmitted electron beams during the capture of a rotation series of images of an observation area 11 around the x axis and the y axis is confirmed. When there is a site that blocks the light path, the site is removed by ion beams. After the confirmation of the light path, the supporting rod 120 is rotated to set θ1 to −90°, the protrusion is thinned until a transmitted image is obtained, specifically until the diameter reaches 100 nm to 300 nm, thereby completing the machining the sample.

Figure 17:
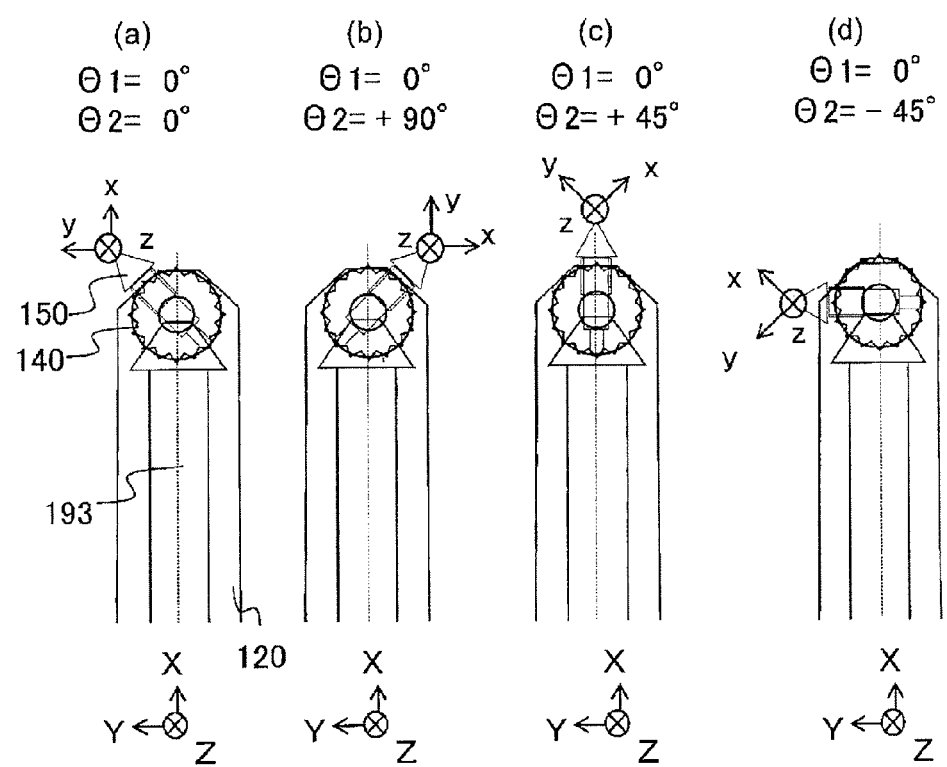
FIGS. 17(a) to 17(d) are block diagrams of a sample holder used in a fourth embodiment, wherein 17(a) illustrates a block diagram of an arrangement of each component in the capture of a rotation series of images of a sample around x axis, 17(b) illustrates a block diagram of an arrangement of each component in the capture of a rotation series of images of a sample around y axis, 17(c) illustrates a block diagram of an arrangement of each component in the observation of a sample with the sample inserted into a narrow gap lens, and 17(d) illustrates a block diagram of an arrangement of each component in use in a sample machining apparatus.

Machining of the sample to a protruded shape using the sample holder illustrated in the second, third, fourth, and fifth embodiments with FIB is also of course possible. When machining with FIB is used, setting in FIG. 9(*d*) is used for the sample holder in the second embodiment, setting in FIG. 14 (*d*) is used for the sample holder in the third embodiment, setting in FIG. 17(*d*) is used for the sample holder in the fourth embodiment, and setting in FIG. 19(*d*) is used for the sample holder in the fifth embodiment. The sample holders in the first, second, third, fourth, and fifth embodiments have the same structure except for the structure of the rotating jig, the slide jig, and the supporting rod, and, thus, the procedure of machining of the sample using these sample holders will be omitted.

Seventh Embodiment

In the seventh embodiment, a case example is illustrated where the sample holder illustrated in the first, second, third, fourth, and fifth embodiments is used and the sample is observed under a general-purpose scanning transmission electron microscope (hereinafter abbreviated to STEM). In this apparatus, a sample is inserted in a lens gap in an objective lens, followed by observation. The inside of the lens gap is in a high magnetic field environment, and there is a possibility that the magnetic field structure of the sample varies depending upon the magnetic field. Accordingly, the analysis of the magnetic field structure with this apparatus is hardly carried out. This apparatus is used for the confirmation of the machined state of the sample or for the analysis of the composition structure of the sample with high resolution. Specifically, when a protrusion 12 of a sample 10 is thinned, the sample is gradually cut so that an observation area 11 is located at the center of the protrusion 12. The face to be cut is determined from the results of observation with this apparatus. Further, after the analysis of the magnetic field structure of the sample, the composition structure of the sample is three-dimensionally analyzed with high resolution, and the results are used when an observation about correspondence to the magnetic field structure is carried out. In the composition structure, that is, in scalar field tomography, one intensity assigned to each pixel is determined. Accordingly, a three-dimensional structure can be reconstructed with a rotation series of images around one axis. That is, there is no need to obtain a rotation series of images around two axes with this apparatus.

Figure 21:
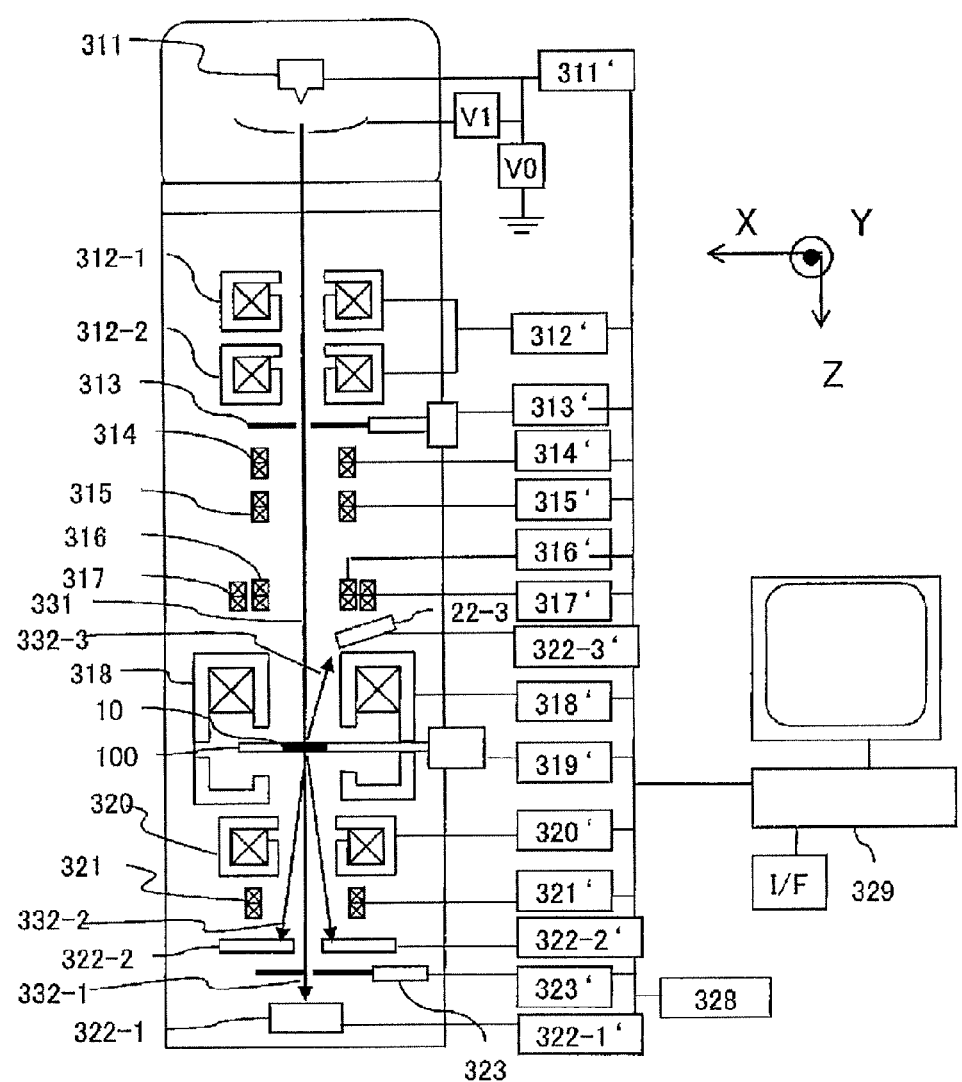
FIG. 21 is a block diagram of a scanning transmission electron microscope.

At the outset, the construction of a general-purpose scanning transmission electron microscope is illustrated in FIG. 21. The scanning transmission electron microscope includes: an electron gun 311 that generates primary electron beams 331, and a control circuit 311' thereof; an irradiation lens 312 that converges primary electron beams 331, and a control circuit 312' thereof; a diaphragm 313 that regulates a spread angle of the primary electron beams 331 and a control circuit 313' thereof; a deflector 314 for axis shift correction that regulates the angle of incidence to the sample 10, and a control circuit 314' thereof; a stigmator 315 that corrects a beam shape of the primary electron beams 331 incident on the sample 10, and a control circuit 315' thereof; a deflector 316 for an image shift that regulates an irradiation area of the primary electron beams 331 incident on the sample 10, and a control circuit 316' thereof; a scanning deflector 317 for raster scanning of the primary electron beams 331 incident on the sample 10, and a control circuit 317' thereof; an objective lens 318 that regulates the position of a focus to the sample 10 of the primary electron beams 331, and a control circuit 318' thereof; a sample stage 319 that sets the position of the sample 10 to the incident electron beams 331 and an inclination angle, and a control circuit 319' thereof; an electron beam detector 322 that detects electron beams 332 generated from the sample 10, and a control circuit 322' thereof; a projector lens 320 that projects electron beams 332 on an electron beam detector 322, and a control circuit 320' thereof; a deflector 321 that deflects electron beams 332, and a control circuit 321' thereof; a diaphragm 323 that regulates a spread angle of electron beams 332, and a control circuit 323' thereof; an image forming circuit 328 that forms a STEM/SEM image from an output signal of the electron beam detector and a raster scanning signal; and a calculator 329 loaded with a control software and an image processing software. Each of the control circuits and the image forming circuit are subjected to command control by the calculator 329. This apparatus is loaded with a plurality of electron beam detectors 322, that is, a bright field detector 322-1 that detects low-angle scattered electrons among electron beams which exit in front of the sample 10, a dark field detector 322-2 that detects high-angle scattered electrons, and a detector 322-3 that detects reflected electrons that exit in rear of the sample 10 and a secondary electron. An image formed with electrons that exit in front of the sample 10 is called STEM image, and an image formed with elecrons that exit in rear of the sample 10 is called SEM image. Thereafter, only the STEM image will be described for simplification purposes. A direction substantially parallel to the light axis of a mirror body is regarded as Z direction, and a face substantially orthogonal to the light axis is regarded as XY plane. Steps up to the capture of STEM images with the apparatus illustrated in FIG. 16 are described, for example, PTL 7 (JP 2009-110734 A).

The size of the sample chamber in a Z direction of the apparatus illustrated in FIG. 21 is narrower than the apparatuses illustrated in FIGS. 2 and 20. In the apparatus illustrated in FIG. 21, the sample is inserted into a lens gap of an in-lens-type objective lens. The lens gap in the in-lens-type objective lens is approximately 5 mm. Further, when a light element cover for X-ray generation suppression is provided, the thickness that allows the sample to be inserted into the lens gap is disadvantageously approximately 3 mm. On the other hand, in the apparatus illustrated in FIG. 2, the sample holder 100 is placed outside the objective lens. In the apparatus illustrated in FIG. 20, an out-lens-type objective lens is used in which the lens is provided only on the upper side of the sample 10. The size of the sample chamber in a Z direction is not less than 10 mm.

Figure 9:
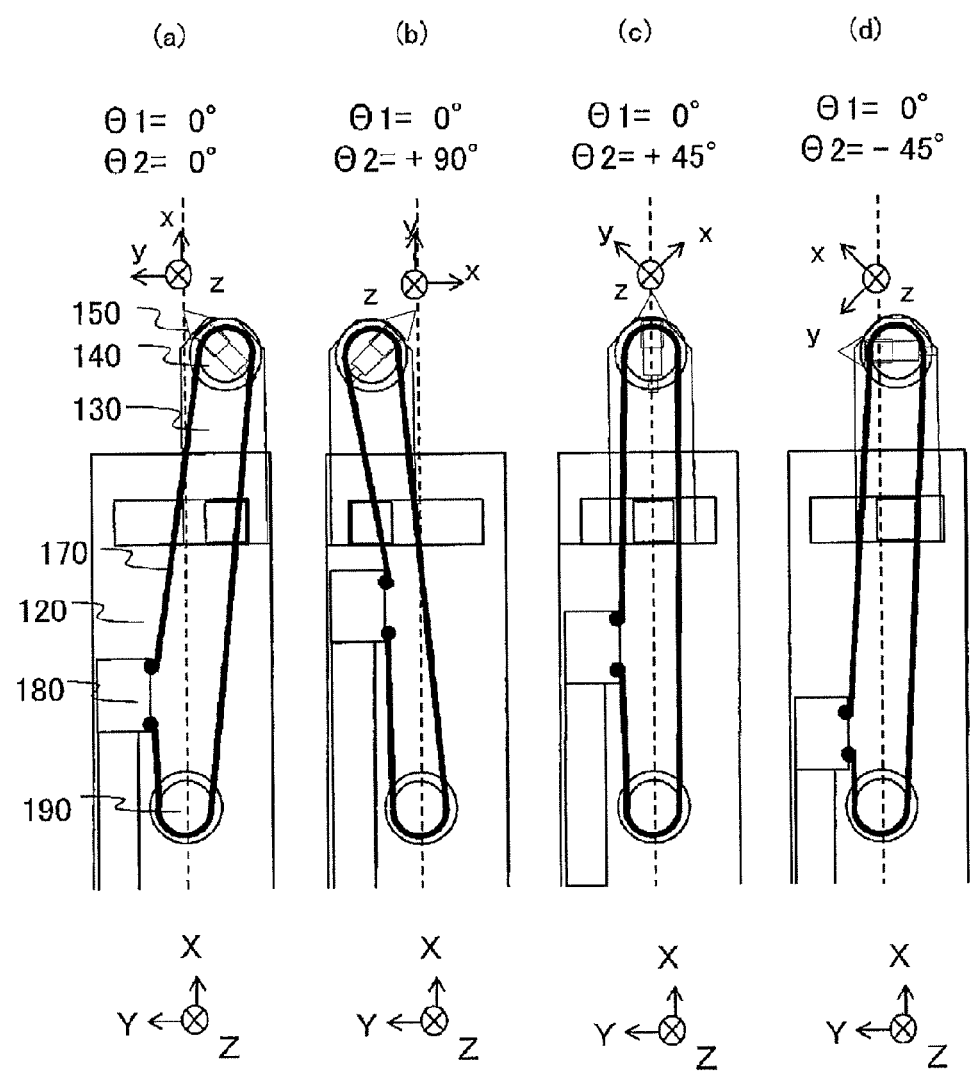
FIGS. 9(a) to 9(d) are block diagrams of a sample holder used in a first embodiment, wherein 9(a) illustrates a block diagram of an arrangement of each component in the capture of a rotation series of images of a sample around x axis, 9(b) illustrates a block diagram of an arrangement of each component in the capture of a rotation series of images of a sample around y axis, 9(c) illustrates a block diagram of an arrangement of each component in the observation of a sample with the sample inserted into a narrow gap lens, and 9(d) illustrates a block diagram of an arrangement of each component in use in a sample machining apparatus.
Figure 10:
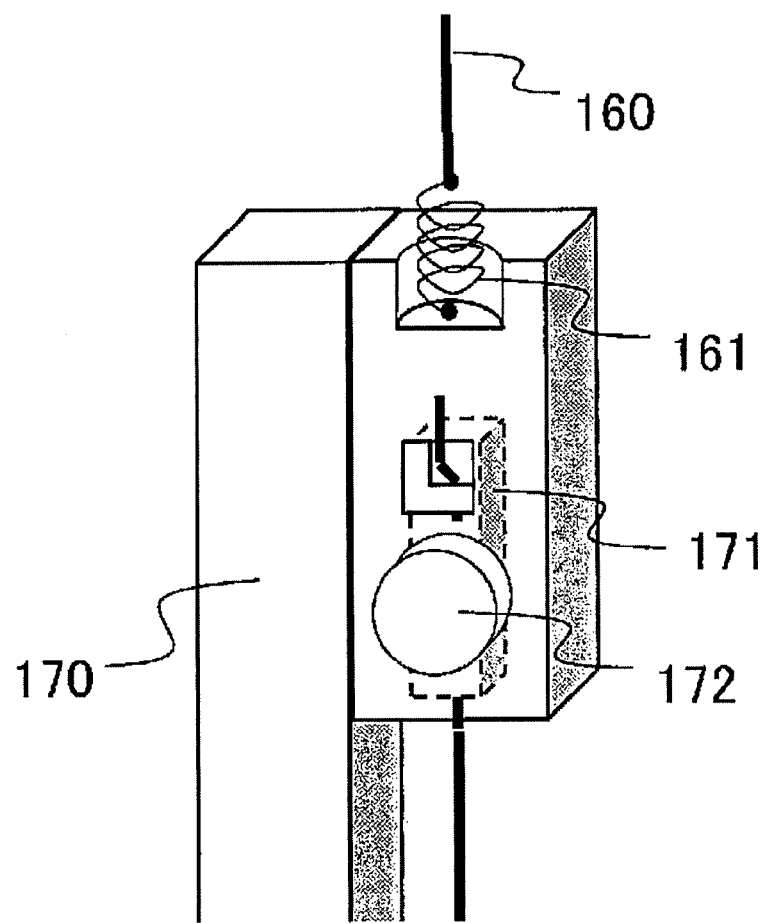
FIG. 10 is a block diagram of a slide rod.

When the arrangement of the component at the tip of the sample holder 100 is set as illustrated in FIG. 9(*a*) and FIG. 9(*b*), the first rotating jig 140 is rotated around the first rotation axis using the diameter of the first rotating jig 140 as a radius. When the diameter of the first rotating jig is 2 mm, the size of the sample chamber in the Z direction should be not less than 4 mm. That is, the sample 10 cannot be rotated within a range of −180° to +180° around the first rotation axis within the sample chamber in the apparatus in FIG. 21.

Figure 6:
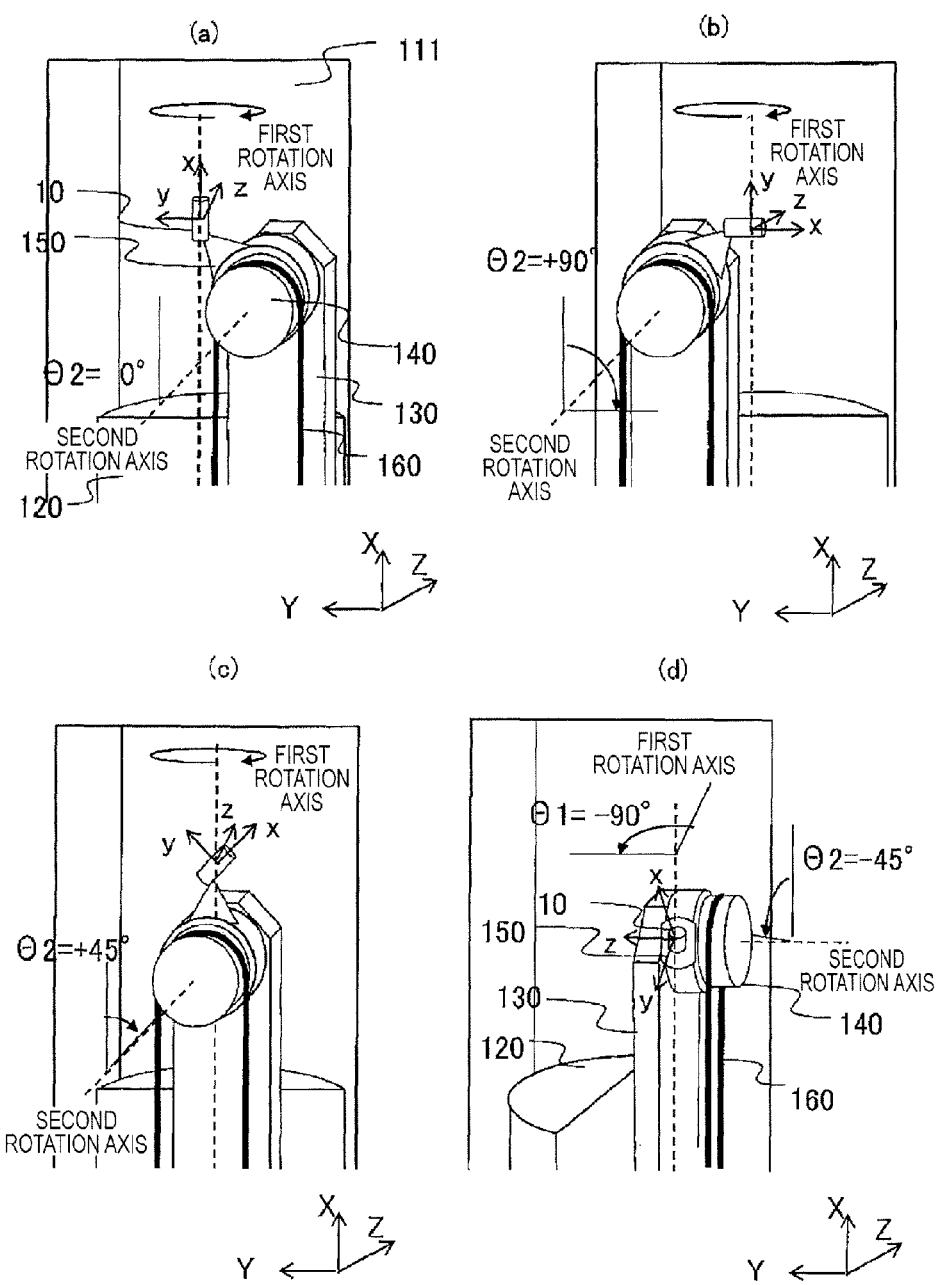
FIGS. 6(a) to 6(d) are block diagrams of a sample holder used in a first embodiment, wherein 6(a) illustrates a block diagram of an arrangement of each component in the capture of a rotation series of images of a sample around x axis, 6(b) illustrates a block diagram of an arrangement of each component in the capture of a rotation series of images of a sample around y axis, 6(c) illustrates a block diagram of an arrangement of each component in the observation of a sample with the sample inserted into a narrow gap lens, and 6(d) illustrates a block diagram of an arrangement of each component in use in a sample machining apparatus.

Accordingly, when the sample 10 is observed with this apparatus, components at the tip of the sample holder are set as illustrated in FIG. 6(*c*). The first rotation axis is rendered parallel to the major axis of the acicular sample base 150, that is, the first rotating jig 140 is rotated so that the angle θ2 of the first rotating jig 140 is substantially +45°. The slide jig 130 is moved to the center of a slide guide 121 so that the sample 10 approaches a position on the first rotation axis. In this arrangement, the first rotating jig 140 is rotated around the first rotation axis using the radius of the first rotating jig 140 as a radius. When the diameter of the first rotating jig is 2 mm, a size of the sample chamber in the Z direction of not less than 2 mm can allow the sample 10 to be rotated in the sample chamber within a range of −180° to +180° around the first rotation axis. Such setting can allow a sample 10 machined by FIB or a sample 10 analyzed under an electron beam interference microscope to be analyzed with this apparatus without the necessity of detaching the sample 10.

Observation of a sample under STEM illustrated in FIG. 21 using the sample holder illustrated in the second, third, fourth, and fifth embodiments is of course possible. In the sample holder in the second embodiment, after the slide jig 130 is placed substantially at the center of the slide guide 121, a screw 124 is screwed for fixation to stabilize the slide jig, followed by insertion into the sample chamber (see FIG. 9(c)). In the sample holder in the third embodiment, the slide jig 130 is moved so that the first rotating jig 140 is located at the center of the slide bearing 129, thereby providing an arrangement illustrated in FIG. 14(c). The guide pin 128 is then passed through the guide hole 127 in the supporting rod 120 and the guide hole 137-2 in the slide jig 130, and the sample holder is inserted into the sample chamber. In the fourth embodiment, the sample holder does not have the slide jig 130, and, thus, the holder in which the rotation angle θ2 of the first rotating jig 140 is set to +45° as such is inserted into the sample chamber (see FIG. 17(c)). In the fourth embodiment, before the sample holder 100 is taken in and out, the position of the sample holder 100 should be returned to a sample stage original point. When this procedure is not carried out, there is a high possibility that, in the insertion of the sample holder 100, the tip of the sample holder collides with the objective lens. In the sample holder in the fifth embodiment, the first rotating jig 140 is rotated so that θ2 is +45°, and a guide pin 146 is passed through a guide hole 147-2 and a guide hole 137 to specify the rotation angle θ2. After the slide jig 130 is moved so that the sample 10 is on the first rotation axis, the sample holder is inserted into the sample chamber. The sample holder illustrated in the first, second, third, fourth, and fifth embodiments may be of course used in other apparatuses in which observation is performed in such a state that the sample is inserted into a lens gap in an in-lens-type objective lens, for example, general-purpose transmission electron microscopes.

Figure 15:
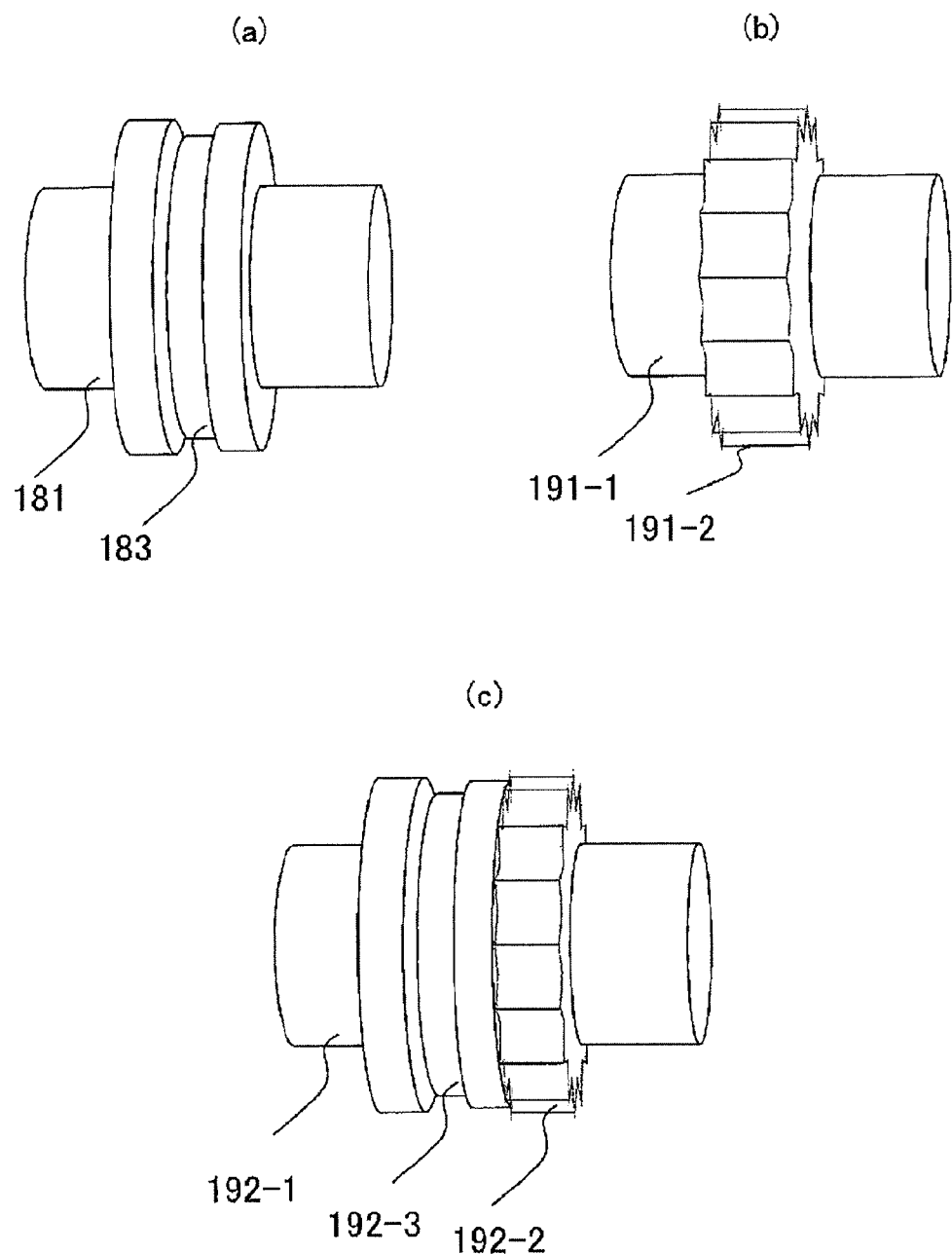
FIGS. 15(a) to 15(c) are block diagrams of a rotating jig, wherein 15(a) illustrates a second rotating jig, 15(b) illustrates a third rotating jig, and 15(c) illustrates a fourth rotating jig.

Finally, here sample holders 100 that can be commonly used in electron beam interference microscopes (FIG. 1), FIB (FIGS. 15(a) to 15(c)), and STEM (FIG. 16) have been described. However, a method may be also be adopted in which each dedicated sample holder is provided, an acicular sample base 150 is shared in use, and a procedure consisting of machining a sample, observing the machined shape and performing additional machining, and capturing a rotation series of images is carried out. That is, the degree of freedom in selecting the apparatus can be increased.

REFERENCE SIGNS LIST

10 ... sample, 11 ... observation area of sample, 12 ... protrusion of sample, 13 ... base of sample, 14 ... projection area in x direction of observation area, 15 ... projection area in y direction of observation area, 100 ... sample holder, 101 ... linear actuator for x-direction movement, 102 ... linear actuator for Y-direction movement, 103 ... linear actuator for Z-direction movement, 104 ... pivot at tip of sample holder, 110 ... holding cylinder, 111 ... opening in holding cylinder, 120 ... holding rod, 121 ... slide guide of holding rod, 122 ... bearing in pivot of second rotating jig, 123 ... screw hole or hole for supporting rod assembling, 124 ... screw for supporting rod assembling, 125 ... bearing in pivot of third rotating jig, 126 ... bearing in pivot of fourth rotating jig, 127 ... guide hole that specifies position of slide jig relative to holding rod, 128 ... guide pin that specifies position of slide jig relative to holding rod, 130 ... slide jig, 131 ... bearing of slide jig, 132 ... protrusion in slide guide of slide jig, 133 ... hole for slide jig assembling, 134 ... screw for slide jig assembling, 135 ... bearing that receives pivot in third rotating jig, 137 ... guide hole that specifies position of slide jig relative to holding rod, 138 ... guide hole that specifies position of first rotating jig relative to slide jig, 140 ... rotating jig, 141 ... pivot in rotating jig, 142 ... screw hole in rotating jig, 143 ... groove in rotating jig, 144 ... first gear in rotating jig, 145 ... first gear in rotating jig, 146 ... guide pin that specifies position of first rotating jig relative to slide jig, 147 ... guide hole that specifies position of first rotating jig relative to slide jig, 150 ... acicular sample base, 151 ... taper in acicular sample base, 152 ... grip in acicular sample base, 153 ... screw in acicular sample base, 154 ... guide in acicular sample base, 160 ... wire, 161 ... elastic portion of wire, 170 ... slide rod, 171 ... hole in slide rod, 172 ... wire pressing screw in slide rod, 180 ... second rotating jig, 181 ... pivot in second rotating jig, 183 ... groove in second rotating jig, 191 ... third rotating jig, 191-1 ... pivot in third rotating jig, 191-2 ... groove in third rotating jig, 192 ... fourth rotating jig, 192-1 ... pivot in fourth rotating jig, 192-2 ... fourth gear in fourth rotating jig, 192-3 ... groove in fourth rotating jig, 193 ... fifth rotating jig, 193-1 ... umbrella gear in fifth rotating jig, 1 ... electron source or electron gun, 18 ... vacuum vessel, 19 ... control unit in electron source, 2 ... light axis, 27 ... orbit of electron beams, 39 ... control unit in sample stage, 40 ... accelerating tube, 41 ... first illuminating (condensing) lens, 42 ... second illuminating (condensing) lens, 47 ... control unit in second irradiation lens, 48 ... control unit in first irradiation lens, 49 ... control unit in accelerating tube, 5 ... objective lens, 51 ... control system computer, 52 ... monitor in control system computer, 53 ... interface in control system computer, 59 ... control unit in objective lens, 61 ... first imaging lens, 62 ... second imaging lens, 63 ... third imaging lens, 64 ... fourth imaging lens, 66 ... control unit in fourth imaging lens, 67 ... control unit in third imaging lens, 68 ... control unit in second imaging lens, 69 ... control unit in first imaging lens, 76 ... monitor in image observation and recording apparatus, 77 ... image recording apparatus, 78 ... control unit in image observation and recording medium, 79 ... image observation and recording medium (e.g., TV camera and CCD camera), 8 ... interference fringe, 89 ... observation and recording surface, 91 ... central ultra-fine line electrode in first electron beam biprism, 93 ... central ultra-fine line electrode in second electron beam biprism, 97 ... control unit in second electron beam biprism, 98 ... control unit in first electron beam biprism, 201 ... primary electron beam, 202 ... secondary electron beam, 203 ... wafer sample, 204 ... focused ion beam, 220 ... vacuum vessel, 230 ... control computer, 235 ... storage unit, 236 ... display unit, 237 ... user interface, 240 ... ion beam illuminating optical system, 240' ... ion beam control unit, 241 ... ion source, 242 ... beam restriction aperture, 243 ... focusing lens, 244 ... deflector, 245 ... objective lens, 260 ... electron beam illuminating optical system, 260' ... electron beam drive unit, 261 ... electron source, 262 ... deflection lens, 263 ... secondary electron beam detector, 263' ... secondary electron beam detector control unit, 271 ... wafer sample stage, 271' ... wafer sample position control unit, 272 ... sample holder position control unit, 281 ... probe, 282 ... probe drive unit, 282' ... probe drive control unit, 283 ... deposit gas supply source, 283' ... deposit gas supply control unit, 311 ... electron gun, 311' ... electron gun control circuit, 312 . . . irradiation lens, 312' . . . irradiation lens control circuit, 313 . . . condenser diaphragm, 313' . . . condenser diaphragm control circuit, 314 . . . deflector for correction of axis shift, 314' . . . deflector control circuit for correction of axis shift, 315 . . . stigmator, 315' . . . stigmator control circuit, 316 . . . deflector for image shift, 316' . . . deflector control circuit for image shift, 317 . . . deflector for scanning, 317' . . . deflector control circuit for scanning, 318 . . . objective lens, 318' . . . objective lens control circuit, 319 . . . sample stage, 319' . . . sample stage control circuit, 320 . . . projector lens, 320' . . . projector lens control circuit, 321 . . . deflector for correction of axis shift, 321' . . . deflector control circuit for correction of axis shift, 322 . . . electron beam detector, 322' . . . electron beam detector control circuit, 323 . . . scatting angle restriction diaphragm, 323' . . . scatting angle restriction diaphragm control circuit, 324 . . . objective aperture, 324' . . . objective aperture control circuit, 325 . . . restriction view diaphragm, 325' . . . restriction view diaphragm control circuit, 326 . . . electron beam detection camera, 326' . . . electron beam detection camera control circuit, 328 . . . image forming circuit, 329 . . . calculator loaded with control software and image processing software, 331 . . . primary electron beams, 332-1 . . . low-angle scattering electron, 332-2 . . . high-angle scattering electron, and 332-3 . . . secondary electron.

The invention claimed is:

1. A sample holder for a charged particle beam microscope, the sample holder comprising:
    a sample mounting base having at its tip portion a mounting portion for mounting a sample thereon;
    a rotating jig having a mounting base holding portion for holding the sample mounting base;
    a sample holding rod having a holding portion for holding the rotating jig;
    a first rotation control unit that applies, to the sample holding rod, a first rotation within a range of −180° to +180° with the extending direction of the sample holding rod as the axis thereof; and
    a second rotation control unit that applies, to the rotating jig, a second rotation within a range of ±45° or more with a direction orthogonal to a rotation axis of the first rotation as the axis thereof, wherein
    the sample mounting base is in a conical or polygonally conical form.

2. The sample holder for a charged particle beam microscope according to claim 1, wherein
    the sample holding rod includes a rotating jig moving portion that moves the rotating jig to a direction of an axis that is orthogonal to each of the first rotation axis and the rotation axis of the second rotation.

3. The sample holder for a charged particle beam microscope according to claim 2, wherein
    the rotating jig moving portion includes a slide groove that positions the sample holding rod and the rotating jig, and
    the rotating jig is slid along the slide groove to a direction of the axis that is orthogonal to each of the rotation axes.

4. The sample holder for a charged particle beam microscope according to claim 1, wherein
    the angle of the conical or the polygonal conical of the sample mounting base is not more than 45°.

5. The sample holder for a charged particle beam microscope according to claim 1, wherein
    the rotating jig is connected to the second rotation control unit through a wire, and
    the second rotation control unit regulates the second rotation by the movement of the wire connected to the second rotation control unit.

6. The sample holder for a charged particle beam microscope according to claim 1, wherein
    the rotating jig includes a first gear that is rotated by the rotation axis of the second rotation,
    the sample holder for a charged particle beam microscope includes a second gear connected to the first gear, and
    the second rotation control unit rotates the second gear to rotate the first gear, thereby regulating the second rotation.

7. A charged particle beam microscope comprising: an illuminating optical system that applies charged particle beams to a sample; and
    a sample holder that sets a position and an angle of the sample to the charged particle beams, wherein
    the sample holder includes
    a sample mounting base having at its tip portion a mounting portion for mounting a sample thereon,
    a rotating jig having a mounting base holding portion for holding the sample mounting base,
    a sample holding rod having a holding portion for holding the rotating jig,
    a first rotation control unit that applies, to the sample holding rod, a first rotation within a range of −180° to +180° with the direction orthogonal to the illumination axis of the charged particle beam as the axis thereof, and
    a second rotation control unit that applies, to the rotating jig, a second rotation within a range of ±45° or more with the direction parallel to an illumination axis of the charged particle beam as the axis thereof, and
    the sample mounting base being in a conical or polygonally conical form.

8. The charged particle beam microscope according to claim 7, wherein
    the sample holding rod includes a rotating jig moving portion that moves the rotating jig to a direction of an axis that is orthogonal to each of the first rotation axis and the second rotation axis.

9. The charged particle beam microscope according to claim 8, wherein
    the rotating jig moving portion includes a slide groove that positions the sample holding rod and the rotating jig, and
    the rotating jig is slid along the slide groove to a direction of the axis that is orthogonal to each of the rotation axes.

10. The charged particle beam microscope according to claim 7, wherein
    the angle of the conical or the polygonal conical of the sample mounting base is not more than 45°.

11. The charged particle beam microscope according to claim 7, wherein
    the rotating jig is connected to the second rotation control unit through a wire, and
    the second rotation control unit regulates the second rotation by the movement of the wire connected to the second rotation control unit.

12. The charged particle beam microscope according to claim 7, wherein
    the rotating jig includes a first gear that is rotated by the rotation axis of the second rotation,
    the sample holder for a charged particle beam microscope includes a second gear connected to the first gear, and
    the second rotation control unit rotates the second gear to rotate the first gear, thereby regulating the second rotation.

13. A charged particle beam microscopy in a charged particle beam microscope including
    an illuminating optical system that applies charged particle beams to a sample, and a sample holder that sets a position and an angle of the sample to the charged particle beams, the charged particle beam microscopy comprising:

a first step of applying, to the sample, a first rotation with the direction orthogonal to the illumination axis of the charged particle beam as the axis thereof to obtain a rotation series of images of an observation area within a range of −180° to +180° around the x axis thereof;

a second step of applying, to the sample, a second rotation within a range of ±45° or more with the direction parallel to an illumination axis of the charged particle beam as the axis thereof; and a third step of applying, to the sample, a third rotation with the direction orthogonal to the illumination axis of the charged particle beam as the axis thereof to obtain a rotation series of images of an observation area within a range of −180° to +180° around the y axis thereof.

14. The charged particle beam microscopy according to claim 13, comprising, between the first step and the third step,
a fourth step of moving the sample to a direction of the axis that is orthogonal to each of the first rotation axis and the second rotation axis.

15. The charged particle beam microscopy according to claim 14, wherein
the sample holder includes a slide groove that determines a position where the sample is moved to a direction of the axis that is orthogonal to each of the first rotation axis and the second rotation axis and
the fourth step includes sliding the sample along the slide groove to a direction of the axis that is orthogonal to each of the rotation axes.

* * * * *